US012813033B2

(12) United States Patent
Lee et al.

(10) Patent No.: US 12,813,033 B2
(45) Date of Patent: Nov. 24, 2026

(54) DISPLAY DEVICE WITH SEAL MEMBER HAVING IMPROVED ADHESION

(71) Applicant: Samsung Display Co., LTD., Yongin-si (KR)

(72) Inventors: Ji Hye Lee, Hwaseong-si (KR); Kyung Bae Kim, Seongnam-si (KR); Yong Hee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 689 days.

(21) Appl. No.: 17/969,974

(22) Filed: Oct. 20, 2022

(65) Prior Publication Data

US 2023/0268469 A1 Aug. 24, 2023

(30) Foreign Application Priority Data

Feb. 24, 2022 (KR) ........................ 10-2022-0024462

(51) Int. Cl.
*G02B 5/20* (2006.01)
*H10H 20/851* (2025.01)
*H10W 90/00* (2026.01)

(52) U.S. Cl.
CPC ......... *H10H 20/8514* (2025.01); *G02B 5/201* (2013.01); *H10W 90/00* (2026.01)

(58) Field of Classification Search
CPC ............. G02F 1/1339; G02F 1/133512; G02F 1/133514; G02F 1/13394; G02F 1/13396; G02F 1/1341; G02B 5/201; H10H 20/8514; H10K 59/8722; H10K 50/8426; H10K 59/871; H10K 50/841; H10K 50/865; H10K 59/88
USPC ............................ 257/40; 349/123, 153, 156
See application file for complete search history.

(56) References Cited

U.S. PATENT DOCUMENTS

| | | | | |
|---|---|---|---|---|
| 11,500,240 | B2 | 11/2022 | Kim et al. | |
| 2009/0303427 | A1* | 12/2009 | Kondo | G02F 1/1339 349/190 |
| 2010/0309416 | A1* | 12/2010 | Gotoh | G02F 1/133514 349/123 |
| 2017/0090226 | A1 | 3/2017 | Oh et al. | |

(Continued)

FOREIGN PATENT DOCUMENTS

| | | |
|---|---|---|
| JP | 11-237621 | 8/1999 |
| KR | 10-1722026 | 4/2017 |

(Continued)

OTHER PUBLICATIONS

Extended European Search Report for European Application No. 23158331.1, dated Jul. 20, 2023.

*Primary Examiner* — David Chen
(74) *Attorney, Agent, or Firm* — Womble Bond Dickinson (US) LLP

(57) ABSTRACT

A display device includes a first substrate including a display area and a non-display area, an inorganic layer disposed on the first substrate in the non-display area, color filter pattern layers disposed on the inorganic layer and spaced apart from each other, a second substrate facing the first substrate, a light blocking member disposed on a surface of the second substrate and not overlapping the color filter pattern layers in the non-display area, and a seal member disposed between the first substrate and the second substrate and contacting the color filter pattern layers and the inorganic layer.

12 Claims, 24 Drawing Sheets

(56) References Cited

U.S. PATENT DOCUMENTS

| | | | | |
|---|---|---|---|---|
| 2021/0063785 | A1* | 3/2021 | Kim | G02F 1/1334 |
| 2023/0317908 | A1 | 10/2023 | Park et al. | |

FOREIGN PATENT DOCUMENTS

| | | | |
|---|---|---|---|
| KR | 10-2020-0113077 | A | 10/2020 |
| KR | 10-2023-0140634 | | 10/2023 |
| WO | 2022-030763 | | 2/2022 |

* cited by examiner

RME: RME1, RME2
CNE: CNE1, CNE2
TR1: ACT, GE, S1, D1

DISPLAY DEVICE WITH SEAL MEMBER HAVING IMPROVED ADHESION

CROSS REFERENCE TO RELATED APPLICATION(S)

This application claims priority to and benefits of Korean Patent Application No. 10-2022-0024462 under 35 U.S.C. § 119, filed on Feb. 24, 2022, in the Korean Intellectual Property Office (KIPO), the entire contents of which are incorporated herein by reference.

BACKGROUND

1. Technical Field

Embodiments relate to a display device.

2. Description of the Related Art

Display devices are becoming increasingly important with the development of multimedia. Accordingly, various types of display devices such as organic light emitting displays and liquid crystal displays are being widely used.

A display device includes a display panel such as a light emitting display panel (e.g., an organic light emitting display panel) or a liquid crystal display panel as a device for displaying an image of the display device. The light emitting display panel may include light emitting elements such as light emitting diodes (LEDs). For example, the LEDs may be organic light emitting diodes (OLEDs) using an organic material as a light emitting material or may be inorganic LEDs using an inorganic material as a light emitting material.

SUMMARY

Embodiments provide a display device capable of improving reliability by improving adhesion of a seal member to block a penetration path of outside air.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, a display device may include a first substrate including a display area and a non-display area, an inorganic layer disposed on the first substrate in the non-display area, color filter pattern layers disposed on the inorganic layer and spaced apart from each other, a second substrate facing the first substrate, a light blocking member disposed on a surface of the second substrate and not overlapping the color filter pattern layers in the non-display area, and a seal member disposed between the first substrate and the second substrate and contacting the color filter pattern layers and the inorganic layer.

In an embodiment, the seal member may be disposed in the non-display area and overlaps the light blocking member, the color filter pattern layers, and the inorganic layer.

In an embodiment, the seal member may contact the inorganic layer exposed between the color filter pattern layers.

In an embodiment, the light blocking member may include openings, and the openings of the light blocking member may overlap the color filter pattern layers in a thickness direction.

In an embodiment, a width of each of the openings of the light blocking member may be substantially equal to a width of each of the color filter pattern layers respectively overlapping the openings of the light blocking member in the thickness direction.

In an embodiment, a gap between the color filter pattern layers may be substantially equal to a width of the light blocking member.

In an embodiment, the display device may further include a color filter layer disposed on the inorganic layer and extending from the display area to the non-display area, wherein the color filter layer may include a first color filter, a second color filter, and a third color filter transmitting light of different colors.

In an embodiment, each of the color filter pattern layers may include a lower pattern layer disposed on the inorganic layer and an upper pattern layer disposed on the lower pattern layer.

In an embodiment, the lower pattern layer may include the same material as the first color filter, and the upper pattern layer may include the same material as the third color filter.

In an embodiment, the display device further may include a middle pattern layer disposed between the lower pattern layer and the upper pattern layer, wherein the middle patter layer may include the same material as the second color filter.

In an embodiment, the seal member may overlap a portion of the color filter layer, and the light blocking member may not overlap the color filter layer.

In an embodiment, the color filter pattern layers may be spaced apart from the color filter layer in the non-display area.

According to an aspect of the disclosure, a display device may include a first substrate including a display area and a non-display area, an inorganic layer disposed on the first substrate in the non-display area, color filter pattern layers disposed on the inorganic layer and spaced apart from each other, a second substrate facing the first substrate, a light blocking member disposed on a surface of the second substrate and having at least a portion overlapping the color filter pattern layers in the non-display area, and a seal member disposed between the first substrate and the second substrate and contacting the color filter pattern layers and the inorganic layer.

In an embodiment, the light blocking member may include openings, and the openings of the light blocking member may overlap the color filter pattern layers in a thickness direction.

In an embodiment, a width of each of the openings of the light blocking member may be smaller than a width of each of the color filter pattern layers.

In an embodiment, a gap between the color filter pattern layers may be smaller than a width of the light blocking member.

In an embodiment, the non-display area may include a first area parallel to a side of the display area, a second area intersecting the first area, and a third area disposed between the first area and the second area and disposed at a corner of the display area.

In an embodiment, the openings of the light blocking member and the color filter pattern layers disposed in the first area may extend in a direction parallel to the side of the display area, the openings of the light blocking member and the color filter pattern layers disposed in the second area may extend in a direction intersecting the side of the display area, and the openings of the light blocking member and the color filter pattern layers disposed in the third area may extend in a diagonal direction between the first direction and the second direction.

In an embodiment, the openings of the light blocking member and the color filter pattern layers disposed in the first area, the second area, and the third area may extend in a direction parallel to or intersecting the side of the display area.

In an embodiment, the openings of the light blocking member may be a slit shape, and the color filter pattern layers may be an island shape.

In a display device according to embodiments, color filter pattern layers spaced apart from each other may be formed to expose an inorganic layer under the color filter pattern layers, so that a seal member may contact the inorganic layer. This may improve the adhesion of the seal member and improve the reliability of the display device.

In addition, the color filter pattern layers may not overlap or partially overlap a light blocking member to prevent reflection of external light, thereby improving display quality.

However, the effects of the disclosure are not restricted to the one set forth herein. The above and other effects of the disclosure will become more apparent to one of daily skill in the art to which the disclosure pertains by referencing the claims.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
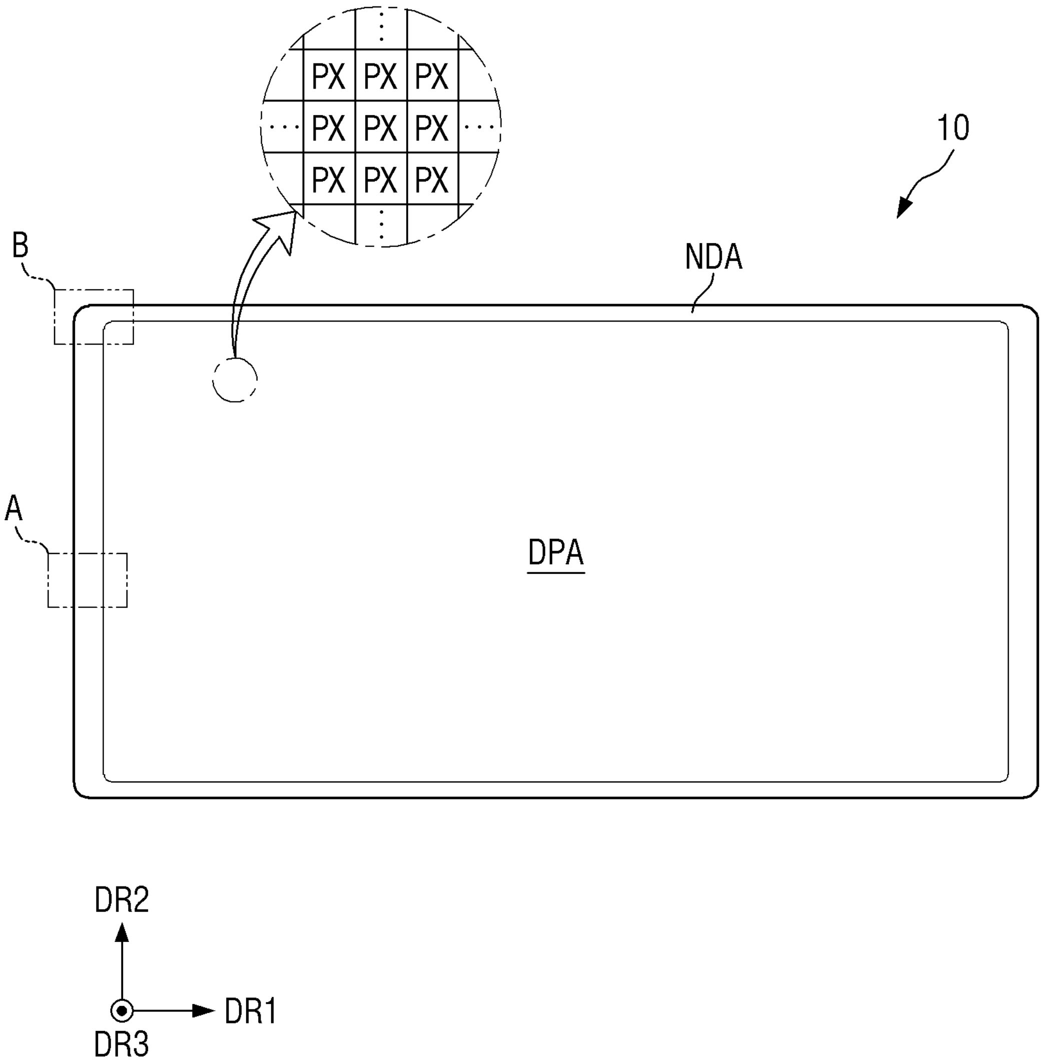
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described with reference to the accompanying drawings.

FIG. 1 is a schematic perspective view of a display device 10 according to an embodiment.

Referring to FIG. 1, the display device 10 may display moving images or still images. The display device 10 may include electronic devices with a display screen. For example, the display device 10 may include televisions, notebook computers, monitors, billboards, Internet of things (IoT) devices, mobile phones, smartphones, tablet personal computers (PCs), electronic watches, smart watches, watch phones, head-mounted displays, mobile communication terminals, electronic notebooks, electronic books, portable multimedia players (PMPs), navigation devices, game consoles, digital cameras, and camcorders, all of which include a display screen.

The display device 10 may include a display panel with a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but embodiments are not limited to this case, and other display panels may be applied as long as the same technical spirit is applicable.

In the drawings, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are positioned. The third direction DR3 is perpendicular to each of the first direction DR1 and the second direction DR2. For example, the third direction DR3 indicates a thickness direction of the display device 10.

The display device 10 may have a rectangular shape including long sides in the first direction DR1 and short sides in the second direction DR2 in a plan view. Each corner where a long side and a short side of the display device 10 meet may be right-angled in a plan view. However, embodiments are not limited thereto, and each corner may also have a rounded/curved shape. The planar shape of the display device 10 is not limited to the rectangular shape, and the display device 10 may have other shapes such as a square, a quadrilateral with rounded corners (e.g., vertices), other polygons, or a circle.

A display surface of the display device 10 may be disposed on a side in the third direction DR3 which is the thickness direction. Unless otherwise mentioned, the term "above" refers to a side in the third direction DR3 and a display direction, and an upper surface refers to a surface facing the side in the third direction DR3. The term "below" refers to another side in the third direction DR3 and a direction opposite to the display direction, and a lower surface refers to a surface facing another side in the third direction DR3. The terms, "left," "right," "upper," and "lower" refer to directions in case that the display device 10 is seen in a plan view. The term "right" refers to a side in the first direction DR1, the term "left" refers to another side in the first direction DR1, the term "upper" refers to a side in the second direction DR2, and the term "lower" refers to another side in the second direction DR2.

The display device 10 may include a display area DPA and a non-display area NDA. The display area DPA may be an area where an image may be displayed, and the non-display area NDA may be an area where an image may not be displayed.

The shape of the display area DPA may be similar to the overall shape of the display device 10. For example, the display area DPA may have a rectangular shape in a plan view. The display area DPA may be disposed in a center area of the display device 10.

The display area DPA may include pixels PX. The pixels PX may be arranged in a matrix pattern. Each of the pixels PX may be rectangular or square in a plan view. However, embodiments are not limited thereto, and each of the pixels PX may have a rhombic planar shape having each side inclined with respect to a direction. The pixels PX may be alternately arranged in a stripe or PENTILE™ type.

The non-display area NDA may be disposed around the display area DPA. The non-display area NDA may entirely or partially surround the display area DPA. In an embodiment, the display area DPA may be rectangular, and the non-display area NDA may be disposed adjacent to four sides of the display area DPA. The non-display area NDA may form a bezel of the display device 10. In the non-display area NDA, wirings or circuit drivers included in the display device 10 may be positioned. For example, a pad unit, on which external devices are mounted, may be positioned in the non-display area NDA.

Figure 2:
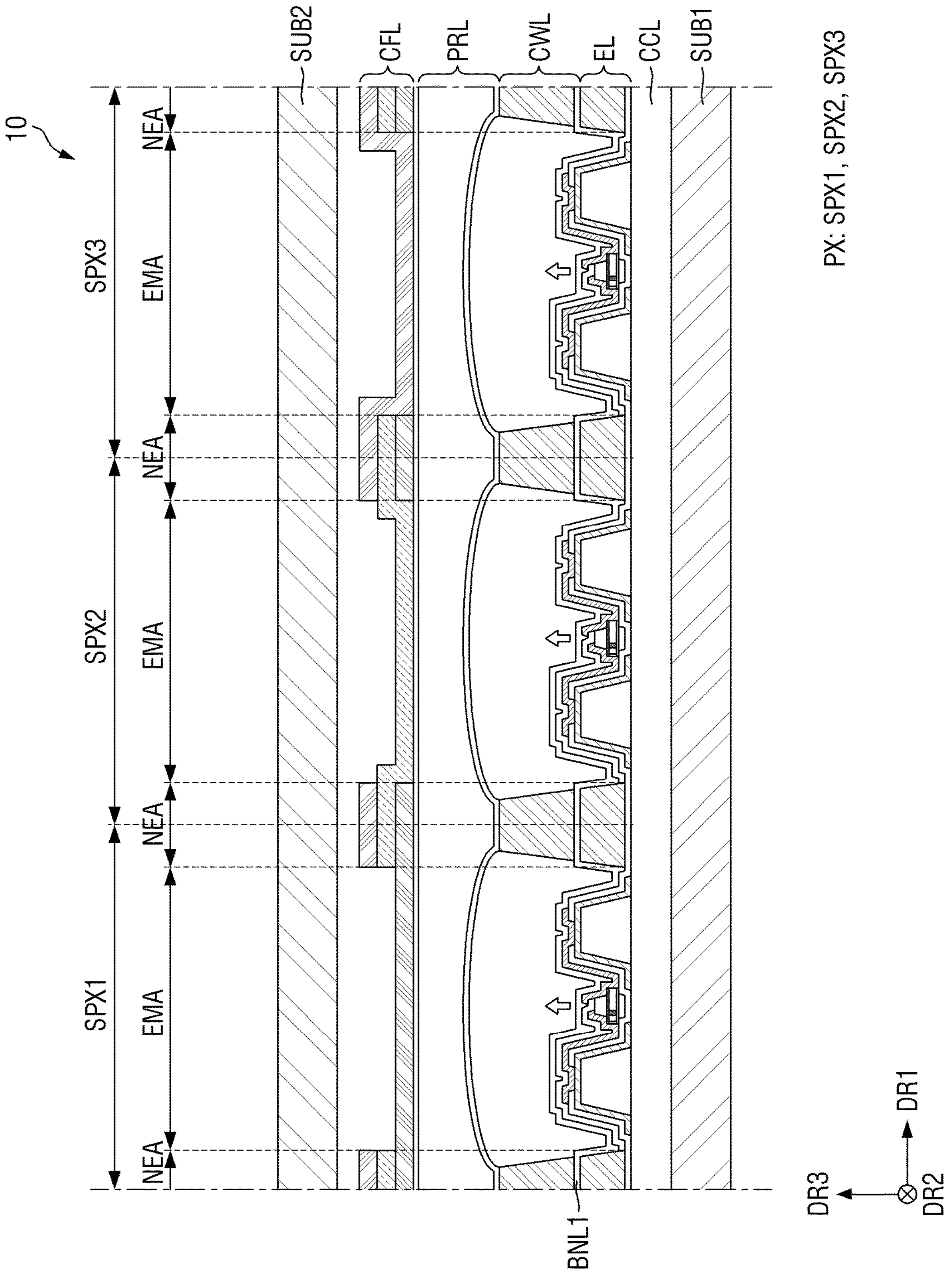
FIG. 2 is a schematic cross-sectional view of the display device according to an embodiment.

FIG. 2 is a schematic cross-sectional view of the display device 10 according to an embodiment.

Referring to FIG. 2, each of the pixels PX may include subpixels SPX1, SPX2, and SPX3. For example, each pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. The first color may be red, the second color may be green, and the third color may be blue. Although each pixel PX includes three subpixels SPX1 through SPX3 in FIG. 2, embodiments are not limited thereto, and the pixel PX may include additional subpixels.

Each of the subpixels SPX1, SPX2, and SPX3 of the display device 10 may include an emission area EMA and a non-emission area NEA. The emission area EMA may be an area in which a light emitting element layer EL is disposed to emit light of a specific wavelength band. The non-emission area NEA may be an area in which the light emitting element layer EL is not disposed and from which no light is output because the light does not reach or transmit this area.

The display device 10 may include a first substrate SUB1, the light emitting element layer EL, a wavelength control layer CWL, a passivation layer PRL, a color filter layer CFL and a second substrate SUB2 disposed on the first substrate SUB1. For example, the display device 10 may further include a circuit layer CCL disposed between the first substrate SUB1 and the light emitting element layer EL. The circuit layer CCL, the light emitting element layer EL, the wavelength control layer CWL, the passivation layer PRL, the color filter layer CFL, and the second substrate SUB2 may be sequentially disposed on the first substrate SUB1.

A first bank BNL may be disposed at boundaries of the subpixels SPX1, SPX2, and SPX3, and the light emitting element layer EL may be disposed in each of the subpixels SPX1, SPX2, and SPX3 separated by the first bank BNL1. The light emitting element layer EL may be disposed between the circuit layer CCL and the wavelength control layer CWL disposed on the first substrate SUB1 and may include light emitting elements ED (see FIG. 3) to emit light of a specific wavelength band. The light may be incident or transmitted on the color filter layer CFL through the wavelength control layer CWL.

The display device 10 according to an embodiment may be a top-emission display device (or a front emission display device) that emits light L in an upward direction of the first substrate SUB1 on which the light emitting element layer EL is disposed. Light emitted from the light emitting element layer EL may travel or transmit downward below the first substrate SUB1, but may be reflected by a structure in the light emitting element layer EL or a structure of the circuit layer CCL to travel or transmit upward above the first substrate SUB1. For example, the display device 10 may be a top-emission display device including only a single substrate by including layers sequentially disposed on the first substrate SUB1.

The display device 10 including the light emitting element layer EL, the wavelength control layer CWL, the passivation layer PRL, and the color filter layer CFL will now be described in detail with further reference to other drawings.

Figure 3:
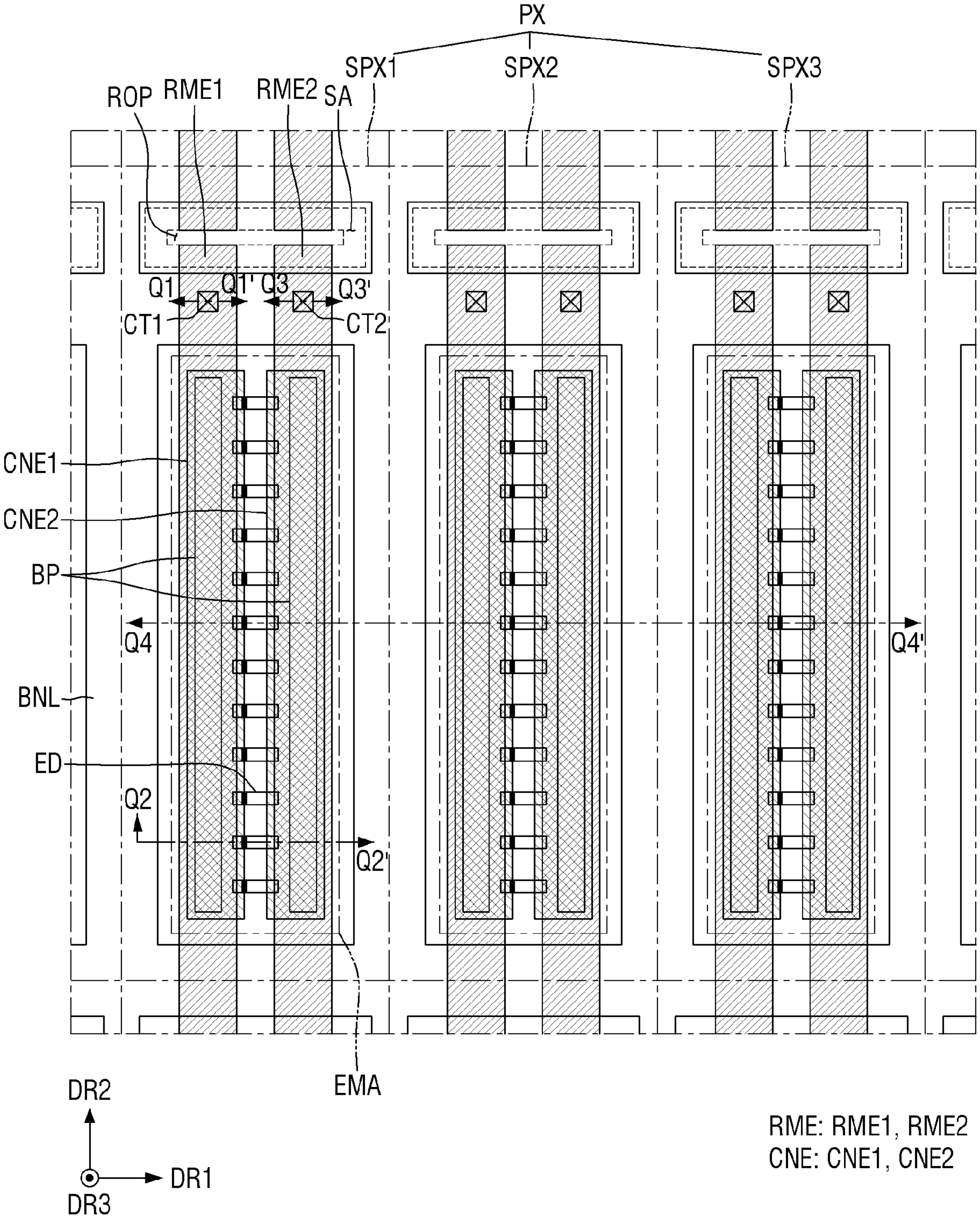
FIG. 3 is a schematic plan view of a light emitting element layer disposed in a pixel of the display device according to an embodiment.
Figure 4:
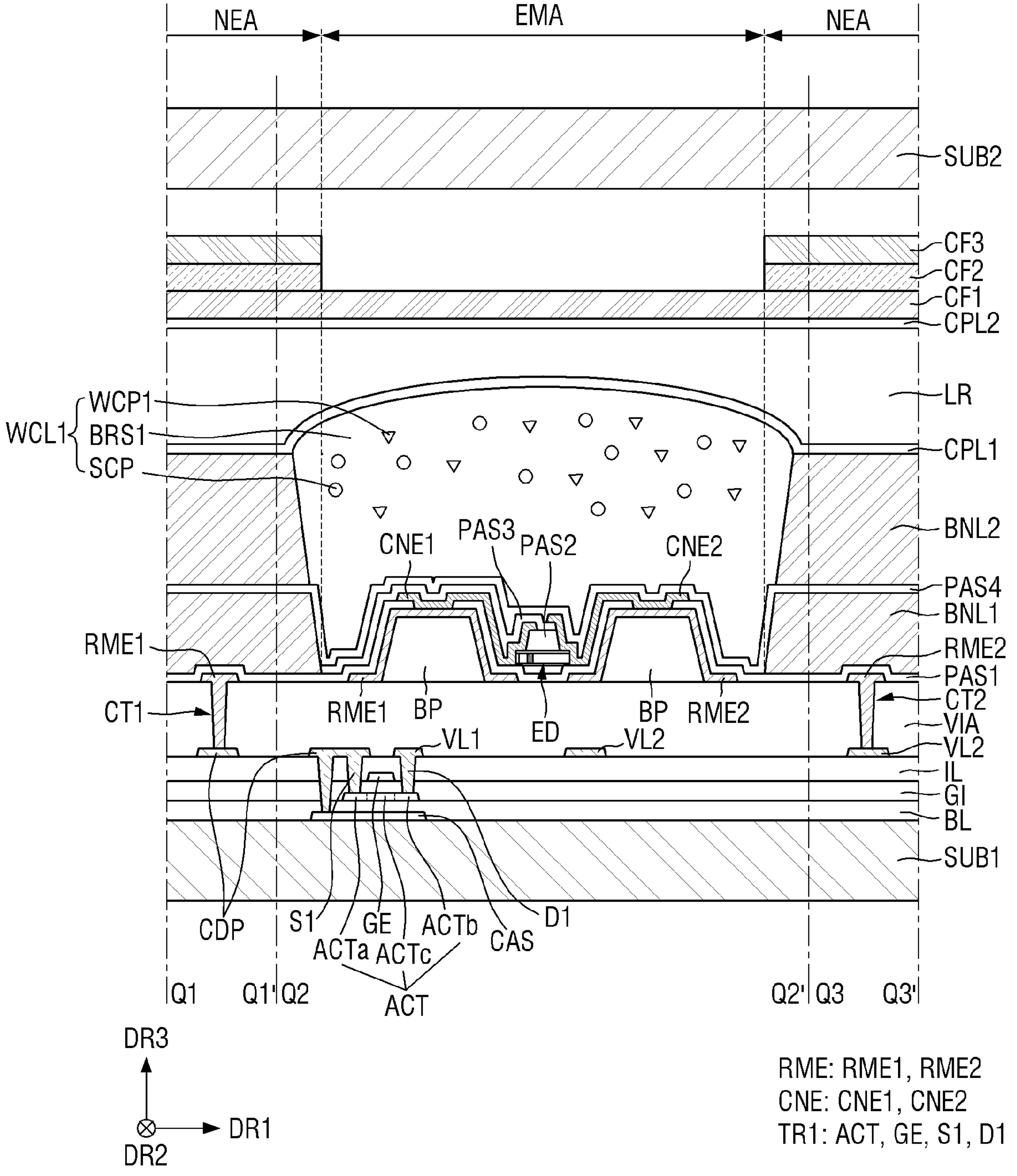
FIG. 4 is a schematic cross-sectional view taken along lines Q1-Q1', Q2-Q2', and Q3-Q3' of FIG. 3.
Figure 5:
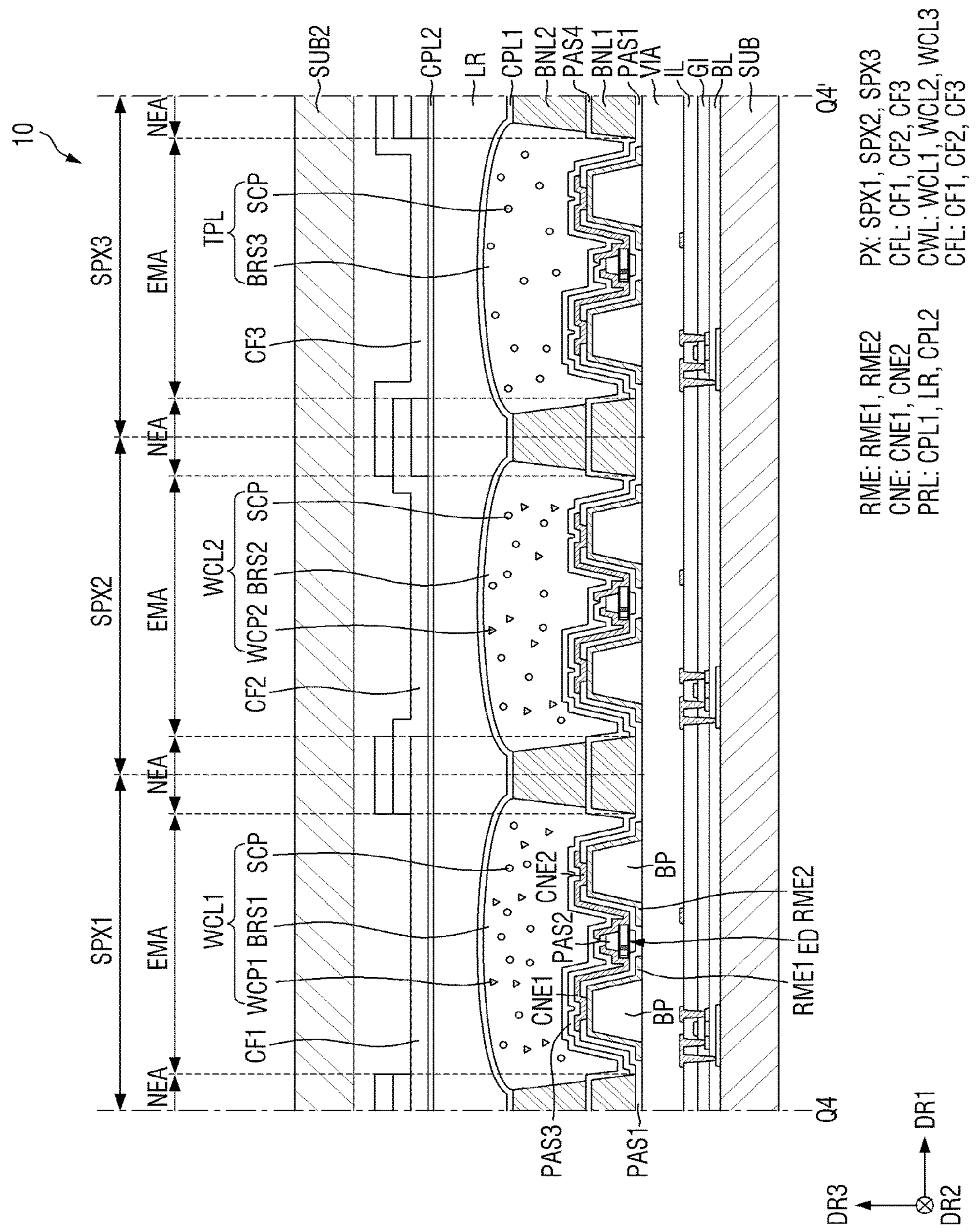
FIG. 5 is a schematic cross-sectional view taken along line Q4-Q4' of FIG. 3.
Figure 6:
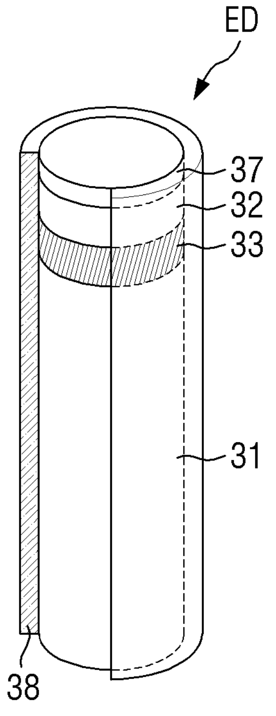
FIG. 6 is a schematic perspective view of a light emitting element of the display device according to an embodiment.

FIG. 3 is a schematic plan view of the light emitting element layer EL disposed in a pixel PX of the display device 10 according to an embodiment. FIG. 4 is a schematic cross-sectional view taken along lines Q1-Q1', Q2-Q2', and Q3-Q3' of FIG. 3. FIG. 5 is a schematic cross-sectional view taken along line Q4-Q4' of FIG. 3. FIG. 6 is a schematic perspective view of a light emitting element ED of the display device 10 according to an embodiment.

FIG. 3 illustrates the light emitting element layer EL, FIG. 4 illustrates a cross section across the first subpixel SPX1, and FIG. 5 illustrates a cross section across the first, second, and third subpixels SPX1, SPX2, and SPX3.

Referring to FIGS. 3, 4, and 5 in connection with FIG. 2, the first bank BNL1 may be disposed at the boundary area of each of the subpixels SPX1, SPX2, and SPX3. The first bank BNL1 may extend in the first direction DR1 and the second direction DR2, surround the subpixels SPX1, SPX2, and SPX3, and separate neighboring subpixels SPX1, SPX2, and SPX3.

Each of the subpixels SPX1, SPX2, and SPX3 may include the non-emission area NEA in addition to the emission area EMA. For example, each of the subpixels SPX1, SPX2, and SPX3 may include a sub-area SA disposed in the non-emission area NEA. The sub-area SA may be disposed on a side of the emission area EMA in the second direction DR2. The sub-area SA may be disposed between the emission areas EMA of subpixels neighboring (or adjacent to each other) in the second direction DR2. Emission areas EMA and sub-areas SA may be arranged in the display area DPA of the display device 10. For example, the emission areas EMA and the sub-areas SA may each be repeatedly arranged in the first direction DR1, but may be alternately arranged in the second direction DR2.

The first bank BNL1 may be disposed between the sub-areas SA and the emission areas EMA, and a gap between the sub-areas SA and the emission areas EMA may vary according to a width of the first bank BNL1 in the first direction DR1 and the second direction DR2. Since the light emitting elements ED are not disposed in the sub-areas SA, light may not be emitted from the sub-areas SA. However, portions of electrodes RME disposed in each of the subpixels SPX1, SPX2, and SPX3 may be disposed in the sub-area SA. The electrodes RME disposed in each of the subpixels SPX1, SPX2, and SPX3 may be separated from the electrodes RME of adjacent subpixels in the sub-area SA.

The first substrate SUB1 may be an insulating substrate. The first substrate SUB1 may be made of a transparent insulating material such as glass, quartz, or polymer resin. For example, the first substrate SUB1 may be a rigid substrate, but may be a flexible substrate that may be bendable, foldable, rollable, etc.

The circuit layer CCL may be disposed on the first substrate SUB1. The circuit layer CCL may include a first conductive layer, a semiconductor layer, a second conductive layer, a third conductive layer, and insulating layers disposed therebetween. Although the circuit layer CCL includes only one first transistor TR1 and some wirings in the drawings, embodiments are not limited thereto. For example, the circuit layer CCL of the display device 10 may include more wirings, electrodes, and semiconductor layers to include more transistors in addition to the first transistor TR1. The circuit layer CCL of the display device 10 may include a capacitor. For example, the display device 10 may include two, three, six, or seven transistors by including one or more transistors in addition to the first transistor TR1 in each of the subpixels SPX1, SPX2, and SPX3.

A first conductive layer CAS may be disposed on the first substrate SUBL. The first conductive layer CAS may overlap an active layer ACT of the first transistor TR1 of the display device 10, e.g., in the third direction DR3. The first conductive layer CAS may include a light blocking material to prevent light from being incident to the active layer ACT of the first transistor TR1. For example, the first conductive layer CAS may be made of an opaque metal material that blocks transmission of light. However, embodiments are not limited thereto. In another example, the first conductive layer CAS may be omitted.

A buffer layer BL may cover (e.g., entirely cover) the first conductive layer CAS and the first substrate SUB1. The buffer layer BL may be formed on the first substrate SUB1 to protect the first transistors TR1 of the subpixels SPX1, SPX2, and SPX3 from moisture introduced (or permeated) through the first substrate SUB1 which is vulnerable to moisture penetration. The buffer layer BL may perform a surface planarization function. The buffer layer BL may be composed of inorganic layers stacked alternately. For example, the buffer layer BL may be a double layer in which inorganic layers including at least any one of silicon oxide ($SiO_x$), silicon nitride ($SiN_x$), and silicon oxynitride (SiON) are stacked or a multilayer in which the inorganic layers are alternately stacked with each other. In another example, each of the inorganic layers may be composed of an inorganic layer including the above materials.

The semiconductor layer may be disposed on the buffer layer BL. The semiconductor layer may include the active layer ACT of the first transistor TR1. The active layer ACT of the first transistor TR1 may be overlapped (e.g., partially overlapped) by a gate electrode GE of the second conductive layer which will be described below.

In an embodiment, the semiconductor layer may include polycrystalline silicon, monocrystalline silicon, an oxide semiconductor, or the like. In case that the semiconductor layer includes an oxide semiconductor, each active layer ACT may include conducting regions ACTa and ACTb and a channel region ACTc between the conducting regions ACTa and ACTb. The oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), or indium-gallium-zinc-tin oxide (IGZTO).

In another embodiment, the semiconductor layer may include polycrystalline silicon. The polycrystalline silicon may be formed by crystallizing amorphous silicon. Each of the conducting regions of the active layer ACT may be a region doped with impurities.

A gate insulating layer GI may be disposed on the semiconductor layer and the buffer layer BL. The gate insulating layer GI may function as a gate insulating film of each transistor. The gate insulating layer GI may be a double layer in which inorganic layers including at least any one of silicon oxide ($SiO_x$), silicon nitride ($SiN_x$), and silicon oxynitride (SiON) are stacked or a multilayer in which the inorganic layers are alternately stacked with each other. In another example, each of the inorganic layers may be composed of an inorganic layer including the above materials.

The second conductive layer may be disposed on the gate insulating layer GI. The second conductive layer may include the gate electrode GE of the first transistor TR1. The gate electrode GE may overlap the channel region ACTc of the active layer ACT in the thickness direction. The second conductive layer may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof. However, embodiments are not limited thereto.

An interlayer insulating layer IL may be disposed on the second conductive layer. The interlayer insulating layer IL may cover the second conductive layer to protect the second conductive layer. The interlayer insulating layer IL may be a double layer in which inorganic layers including at least any one of silicon oxide ($SiO_x$), silicon nitride ($SiN_x$), and silicon oxynitride (SiON) are stacked or a multilayer in which the inorganic layers are alternately stacked with each other. In another example, each of the inorganic layers may be composed of an inorganic layer including the above materials.

The third conductive layer may be disposed on the interlayer insulating layer IL. The third conductive layer may include a source electrode S1 and a drain electrode D1 of the first transistor TR1, a first voltage wiring VL1, a second voltage wiring VL2, and a conductive pattern layer CDP.

The source electrode S1 and the drain electrode D1 of the first transistor TR1 may respectively contact the conducting regions ACTa and ACTb of the active layer ACT through contact holes penetrating the interlayer insulating layer IL and the gate insulating layer GI. For example, the source electrode S1 of the first transistor TR1 may be connected (e.g., electrically connected) to the first conductive layer CAS through another contact hole.

A high-potential voltage (or a first power supply voltage) supplied to a first electrode RME1 may be applied to the first voltage wiring VL1, and a low-potential voltage (or a second power supply voltage) supplied to a second electrode RME2 may be applied to the second voltage wiring VL2. A portion of the first voltage wiring VL1 may contact the active layer ACT of the first transistor TR1 through a contact hole penetrating the interlayer insulating layer IL and the gate insulating layer GI. The first voltage wiring VL1 may function as the drain electrode D1 of the first transistor TR1. The first voltage wiring VL1 may be connected (e.g., electrically connected) to the first electrode RME1 to be described below. The second voltage wiring VL2 may be connected (e.g., directly connected) to the second electrode RME2 to be described later.

The conductive pattern layer CDP may be connected to the active layer ACT of the first transistor TR1 through a contact hole penetrating the interlayer insulating layer IL and the gate insulating layer GI. The conductive pattern layer CDP may function as the source electrode S1 of the first transistor TR1.

The third conductive layer may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof. However, embodiments are not limited thereto.

A via layer VIA may be disposed on the third conductive layer. The via layer VIA may include an organic insulating material, for example, an organic material such as polyimide (PI) and may perform a surface planarization function.

Electrodes RME (e.g., RME1 and RME2), bank pattern layers BP, the first bank BNL1, light emitting elements ED, and connection electrodes CNE1 and CNE2 may be disposed as the light emitting element layer EL on the via layer VIA. For example, insulating layers PAS1, PAS2, and PAS3 may be disposed on the via layer VIA.

The bank pattern layers BP may be disposed (e.g., directly disposed) on the via layer VIA. The bank pattern layers BP may extend in the second direction DR2 in each of the subpixels SPX1, SPX2, and SPX3. For example, the bank pattern layers BP may be disposed within the emission area EMA of each of the subpixels SPX1, SPX2, and SPX3, but may not extend to other neighboring subpixels SPX1, SPX2, and SPX3 in the second direction DR2. For example, the bank pattern layers BP may be spaced apart from each other in the first direction DR1, and the light emitting elements ED may be disposed between the bank pattern layers BP. The bank pattern layers BP may be disposed in each of the subpixels SPX1, SPX2, and SPX3 to form linear pattern layers in the display area DPA of the display device 10. Although two bank pattern layers BP are illustrated in the drawings, embodiments are not limited thereto. The number of the bank pattern layers BP may be increased according to the number of the electrodes RME1 and RME2.

At least a portion of each of the bank pattern layers BP may protrude from an upper surface of the via layer VIA. The protruding portion of each of the bank pattern layers BP may have inclined side surfaces (or inclined lateral surfaces), and light emitted from the light emitting elements ED may be reflected by the electrodes RME disposed on the bank pattern layers BP to travel (or transmit) toward above the via layer VIA. The first bank pattern layers BP may include an area where the light emitting elements ED are positioned, and may function as reflective barriers that reflect light emitted from the light emitting elements ED in the upward direction (e.g., in the third direction DR3) The side surfaces of the bank pattern layers BP may be inclined in a linear shape. However, embodiments are not limited thereto, and outer surfaces of the bank pattern layers BP may have a curved semi-circular or semi-elliptical shape. The bank pattern layers BP may include an organic insulating material such as polyimide (PI), but embodiments are not limited thereto.

The electrodes RME may be disposed on the bank pattern layers BP and the via layer VIA. The electrodes RME may include the first electrode RME1 and the second electrode RME2. The first electrode RME1 and the second electrode RME2 may extend in the second direction DR2 and may be spaced apart from each other in the first direction DR1.

The first electrode RME1 and the second electrode RME2 may extend in the second direction DR2 in each of the subpixels SPX1, SPX2, and SPX3, but may be separated from other electrodes RME1 and RME2 in the sub-area SA. For example, the sub-area SA may be disposed between the emission areas EMA of subpixels neighboring in a direction opposite to the second direction DR2. The first electrode RME1 and the second electrode RME2 may be separated, in a separation portion ROP of the sub-area SA, from another first electrode RME1 and another second electrode RME2 disposed in a subpixel neighboring in the second direction DR2. However, embodiments are not limited thereto, and some electrodes RME1 and RME2 may not be separated for each of the subpixels SPX1, SPX2, and SPX3, but may extend beyond a subpixel neighboring in the second direction DR2, or only one of the first electrode RME1 and the second electrode RME2 may be separated.

The first electrode RME1 may be connected (e.g., electrically connected) to the first transistor TR1 through a first electrode contact hole CT1, and the second electrode RME2 may be connected (e.g., electrically connected) to the second voltage wiring VL2 through a second electrode contact hole CT2. For example, the first electrode RME1 may contact the conductive pattern layer CDP through the first electrode contact hole CT1 penetrating the via layer VIA in an area overlapping the first bank BNL1, e.g., between the sub-area SA and the emission area EMA. The second electrode RME2 may contact the second voltage wiring VL2 through the second electrode contact hole CT2 penetrating the via layer VIA However, embodiments are not limited thereto. In an embodiment, the first electrode contact hole CT1 and the second electrode contact hole CT2 may be disposed in the sub-area SA.

The first electrode contact hole CT1 may connect the first electrode RME1 and the conductive pattern layer CDP. A signal for aligning (or arranging) the light emitting elements ED may be transmitted to the first voltage wiring VL1 and transmitted to the first electrode RME1 through the first transistor TR1 and the conductive pattern layer CDP. The second electrode contact hole CT2 may connect the second electrode RME2 and the second voltage wiring VL2. The second power supply voltage may be applied to the second electrode RME2 through the second voltage wiring VL2. The first electrode RME1 and the second electrode RME2 may be separated in the separation portion ROP after the light emitting elements ED are aligned as will be described below. Therefore, the second electrode RME2 may not receive a signal from the second voltage wiring VL2.

Although a single first electrode RME1 and a single second electrode RME2 are disposed in each of the subpixels SPX1, SPX2, and SPX3 in the drawings, embodiments are not limited thereto. More first electrodes RME1 and more second electrodes RME2 may be disposed in each of the subpixels SPX1. SPX2, and SPX3. For example, the first electrode RME1 and the second electrode RME2 disposed in each of the subpixels SPX1, SPX2, and SPX3 may not extend in a single direction and may be disposed in various suitable structures. For example, the first electrode RME1 and the second electrode RME2 may be partially curved or bent, or any one of the first electrode RME1 and the second electrode RME2 may surround another electrode.

The first electrode RME1 and the second electrode RME2 may be disposed (e.g., directly disposed) on the bank pattern layers BP, respectively. The first electrode RME1 and the second electrode RME2 may have widths greater than widths of the bank pattern layers BP, respectively, in the first direction DR1 (e.g., in a plan view). For example, the first electrode RME1 and the second electrode RME2 may cover the outer surfaces of the bank pattern layers BP, respectively. The first electrode RME1 and the second electrode RME2 may be disposed on the side surfaces of the bank pattern layers BP, respectively, and a distance between the first electrode RME1 and the second electrode RME2 may be smaller than a distance between the bank pattern layers BP. For example, at least a portion of each of the first electrode RME1 and the second electrode RME2 may be disposed (e.g., directly disposed) on the via layer VIA so that they line in the same plane. However, embodiments are not limited thereto. In some cases, the first electrode RME1 and the second electrode RME2 may have widths smaller than widths of the bank pattern layers BP. However, each of the first electrode RME1 and the second electrode RME2 may cover at least one side surface of a bank pattern layer BP to reflect light emitted from the light emitting elements ED.

The first electrode RME1 and the second electrode RME2 may include a conductive material having high reflectivity. For example, each of the first electrode RME1 and the second electrode RME2 may include a metal such as silver (Ag), copper (Cu), or aluminum (Al) as a material having high reflectivity or may be an alloy containing aluminum (Al), nickel (Ni), or lanthanum (La). The first electrode RME1 and the second electrode RME2 may reflect light, which travels (or transmits) toward the side surfaces of the bank pattern layers BP after being emitted from the light emitting elements ED, toward above each of the subpixels SPX1, SPX2, and SPX3.

However, embodiments are not limited thereto, and the first electrode RME1 and the second electrode RME2 may further include a transparent conductive material. For example, the first electrode RME1 and RME2 may include a material such as indium-tin oxide (ITO), indium-zinc oxide (IZO), or indium-tin-zinc oxide (ITZO). In some embodiments, the first electrode RME1 and the second electrode RMLE2 may have a structure in which a transparent conductive material and a metal layer having high reflectivity are each stacked in one or more layers or may be formed as a single layer including the transparent conductive material and the metal layer. For example, the first electrode RME1 and the second electrode RME2 may have a stacked structure of ITO/Ag/ITO, ITO/Ag/IZO, or ITO/Ag/ITZO/IZO.

The first and second electrodes RME1 and RME2 may be utilized to generate an electric field in each of the subpixels SPX1, SPX2, and SPX3 so as to align the light emitting elements ED. The light emitting elements ED may be arranged between the first electrode RME1 and the second electrode RME2 by the electric field formed on the first electrode RME1 and the second electrode RME2. The light emitting elements ED of the display device 10 may be sprayed (or injected) onto the electrodes RME through an inkjet printing process. In case that ink including the light emitting elements ED is sprayed onto the electrodes RME, an alignment signal may be transmitted to the electrodes RME to generate an electric field. A voltage (e.g., a predetermined voltage) may be applied to the first electrode RME1 and the second electrode RME2 through the first voltage wiring VL1 and the second voltage wiring VL2 so that the light emitting elements ED may be aligned. The light emitting elements ED dispersed in the ink may be aligned by a dielectrophoretic force applied by the electric field generated on the electrodes RME1 and RME2.

The electrodes RME1 and RME2 disposed in different subpixels neighboring in the second direction DR2 may be spaced apart from each other in the separation portion ROP of the sub-area SA. This arrangement of the electrodes RME1 and RME2 may be implemented by forming electrode lines extending in the second direction DR2 and by separating the electrode lines in a subsequent process after the light emitting elements ED are placed. The electrode lines may be utilized to generate an electric field in each subpixel to align the light emitting elements ED during a process of manufacturing the display device 10. After the light emitting elements ED are aligned, the electrode lines may be separated in the separation portion ROP to form the electrodes RME1 and RME2 spaced apart from each other in the second direction DR2.

A first insulating layer PAS1 may be disposed on the via layer VIA, the bank pattern layers BP, and the electrodes RME1 and RME2. The first insulating layer PAS1 may be disposed on the via layer VIA to cover the electrodes RME1 and RME2 and the bank pattern layers BP. The first insulating layer PAS1 may be disposed in the sub-area SA, but may not be disposed in the separation portion ROP in which the electrodes RME1 and RME2 are spaced apart from each other. The first insulating layer PAS1 may protect the electrodes RME1 and RME2 by insulating the different electrodes RME1 and RME2 from each other. For example, the first insulating layer PAS1 may prevent the light emitting elements ED disposed thereon from contacting (e.g., directly contacting) other members such that the light emitting elements ED may not be damaged.

In an embodiment, the first insulating layer PAS1 may be stepped such that a portion of an upper surface of the first insulating layer PAS1 may be depressed (or recessed) between the electrodes RME1 and RME2 spaced apart from each other in the first direction DR1. The light emitting elements ED may be disposed on the stepped upper surface of the first insulating layer PAS1, and a space may be formed between the light emitting elements ED and the first insulating layer PAS1.

The first bank BNL1 may be disposed on the first insulating layer PAS1. The first bank BNL1 may be disposed in a grid pattern including portions extending in the first direction DR1 and the second direction DR2 in a plan view. The first bank BNL1 may be disposed at the boundary area of each of the subpixels SPX1, SPX2, and SPX3 to separate neighboring subpixels SPX1, SPX2, and SPX3 For example, the first bank BNL1 may surround the emission area EMA and the sub-area SA, and areas separated and exposed by the first bank BNL1 may be the emission area EMA and the sub-area SA, respectively.

The first bank BNL1 may have a height (e.g., a predetermined height). In some embodiments, an upper surface of the first bank BNL1 may be at a height greater than heights of the bank pattern layers BP, and a thickness of the first bank BNL1 may be equal to or greater than thicknesses of the bank pattern layers BP. However, embodiments are not limited thereto, and the upper surface of the first bank BNL1 may be at a height equal to or smaller than the heights of the bank pattern layers BP, and the thickness of the first bank BNL1 may be smaller than the thicknesses of the bank pattern layers BP. The first bank BNL1 may prevent ink from overflowing to each adjacent subpixel SPX1, SPX2 or SPX3 in an inkjet printing process during the manufacturing process of the display device 10. The first bank BNL1 may prevent mixing of inks in which different light emitting elements ED are dispersed for different subpixels SPX1, SPX2, and SPX3. Like the bank pattern layers BP, the first bank BNL1 may include polyimide, but embodiments are not limited thereto.

The light emitting elements ED may be disposed on the first insulating layer PAS1. Each of the light emitting elements ED may include layers positioned in a direction parallel to an upper surface of the first substrate SUB1. A direction in which the light emitting elements ED of the display device 10 extend may be parallel to the first substrate SUB1, and semiconductor layers included in each of the light emitting elements ED may be sequentially positioned along the direction parallel to the upper surface of the first substrate SUB1. However, embodiments are not limited thereto. In some cases, in case that each of the light emitting elements ED has a different structure, the layers may be positioned in the third direction DR3 perpendicular to the first substrate SUB1.

The light emitting elements ED may be spaced apart from each other along the second direction DR2 in which each of the electrodes RME1 and RME2 extends and may be aligned substantially parallel to each other. The light emitting elements ED may extend in an extension direction (e.g., in the first direction DR1), and the electrodes RME1 and RME2 may extend in a direction (e.g., the second direction DR2), which is substantially perpendicular to the extension direction of the light emitting elements ED. However, embodiments are not limited thereto, and the light emitting elements ED may extend in a direction not perpendicular but oblique to the direction in which the electrodes RME1 and RME2 extend.

The light emitting elements ED disposed in each of the subpixels SPX1, SPX2, and SPX3 may include light emitting layers to emit light of the same wavelength band to the outside. Accordingly, light of the same color may be emitted from the first subpixel SPX1, the second subpixel SPX2, and the third subpixel SPX3. However, embodiments are not limited thereto, and the subpixels SPX1, SPX2, and SPX3 may include different types of light emitting elements ED to emit light of different colors.

Ends (e.g., opposite ends) of each light emitting element ED may be respectively disposed on the electrodes RME1 and RME2 between the bank pattern layers BP. A length by which the light emitting elements ED extend may be greater than the distance between the first electrode RME1 and the second electrode RME2, and ends (e.g., opposite ends) of each light emitting element ED may be disposed on the first electrode RME1 and the second electrode RME2, respectively. For example, an end of each light emitting element ED may be disposed on the first electrode RME1, and another end may be disposed on the second electrode RME2.

Ends (e.g., opposite ends) of each light emitting element ED may contact the connection electrodes CNE1 and CNE2, respectively. For example, an insulating film 38 (see FIG. 6) may not be formed on end surfaces of each light emitting element ED in the direction in which the light emitting elements ED extend, thereby partially exposing semiconductor layers 31 and 32 (see FIG. 6) or an electrode layer 37 (see FIG. 6). Thus, the exposed semiconductor layers or electrode layer may contact the connection electrodes CNE1 and CNE2. However, embodiments are not limited thereto. At least a portion of the insulating film 38 of each light emitting element ED may be removed to partially expose side surfaces of ends (e.g., opposite ends) of the semiconductor layers. The exposed side surfaces of the semiconductor layers may contact (e.g., directly contact) the connection electrodes CNE1 and CNE2.

A second insulating layer PAS2 may be disposed on a portion of each light emitting element ED. For example, the second insulating layer PAS2 disposed on the light emitting elements ED may have a width smaller than the length of each light emitting element ED. Thus, the second insulating layer PAS2 may cover the light emitting elements ED but expose ends (e.g., opposite ends) of the light emitting elements ED. The second insulating layer PAS2 may cover the light emitting elements ED, the electrodes RME1 and RME2 and the first insulating layer PAS1 and may be patterned to expose ends (e.g., opposite ends) of the light emitting elements ED during the manufacturing process of the display device 10. The second insulating layer PAS2 may extend in the second direction DR2 on the first insulating layer PAS1 and the light emitting elements ED in a plan view to form a linear or island-shaped pattern in each of the subpixels SPX1, SPX2, and SPX3. The second insulating layer PAS2 may protect the light emitting elements ED with anchoring (or fixing) the light emitting elements ED in the manufacturing process of the display device 10.

The connection electrodes CNE1 and CNE2 may be disposed on the first insulating layer PAS1, the second insulating layer PAS2, and the light emitting elements ED.

The connection electrodes CNE1 and CNE2 may be disposed on the electrodes RME1 and RME2, respectively. The connection electrodes CNE1 and CNE2 may include a first connection electrode CNE1 disposed on the first electrode RME1 and a second connection electrode CNE2 disposed on the second electrode RME2. The connection electrodes CNE1 and CNE2 may be spaced apart from each other or may face each other. For example, the first connection electrode CNE1 and the second connection electrode CNE2 may be disposed on the first electrode RME1 and the second electrode RME2, respectively, and may be spaced apart from each other in the first direction DR1.

The first connection electrode CNE1 may extend in the second direction DR2 within the emission area EMA. The first connection electrode CNE1 may overlap the first electrode RME1 and may be disposed parallel to the first electrode RME1. The first connection electrode CNE1 may extend in the second direction DR2.

The second connection electrode CNE2 may extend in the second direction DR2 within the emission area EMA. The second connection electrode CNE2 may overlap the second electrode RME2 and may be disposed parallel to the second electrode RME2. The second connection electrode CNE2 may extend in the second direction DR2.

Each of the connection electrodes CNE1 and CNE2 may contact the light emitting elements ED. The first connection electrode CNE1 may contact an end of each light emitting element ED, and the second connection electrode CNE2 may contact another end of each light emitting element ED. The semiconductor layers or the electrode layer may be exposed on end surfaces (e.g., opposite end surfaces) of each light emitting element ED in the direction in which the light emitting elements ED extend, and the connection electrodes CNE1 and CNE2 may be connected (e.g., electrically connected) to the light emitting elements ED by contacting the semiconductor layers or the electrode layer of each light emitting element ED. Respective sides of the connection electrodes CNE1 and CNE2 which contact ends (e.g., opposite ends) of each light emitting element ED may be disposed on side surfaces of the second insulating layer PAS2. In an embodiment, the first connection electrode CNE1 may be disposed on a side surface of the second insulating layer PAS2, and the second connection electrode CNE2 may be disposed on another side surface of the second insulating layer PAS2.

Widths of the connection electrodes CNE1 and CNE2 measured in a direction may be smaller than widths of the electrodes RME1 and RME2 measured in the direction, respectively. The connection electrodes CNE1 and CNE2 may respectively contact an end and another end of each light emitting element ED and partially cover upper surfaces of the first electrode RME1 and the second electrode RME2. However, embodiments are not limited thereto, and the connection electrodes CNE1 and CNE2 may have greater widths than the electrodes RME1 and RME2 to cover sides (e.g., opposite sides) of the electrodes RME1 and RME2.

The connection electrodes CNE1 and CNE2 may include a transparent conductive material such as ITO, IZO, ITZO, or aluminum (Al). Light emitted from the light emitting elements ED may pass through the connection electrodes CNE1 and CNE2 to travel or transmit upward. However, embodiments are not limited thereto.

Although two connection electrodes CNE1 and CNE2 are disposed in each of the subpixels SPX1, SPX2, and SPX3 in the drawings, embodiments are not limited thereto. The number of the connection electrodes CNE1 and CNE2 may vary according to the number of the electrodes RME1 and RME2 disposed in each of the subpixels SPX1, SPX2, and SPX3.

A third insulating layer PAS3 may be disposed on the first connection electrode CNE1. The third insulating layer PAS3 may electrically insulate the first connection electrode CNE1 and the second connection electrode CNE2 from each other. The third insulating layer PAS3 may cover the first connection electrode CNE1 but may not be disposed on another end of each light emitting element ED so that the light emitting elements ED may contact the second connection electrode CNE2. The third insulating layer PAS3 on an upper surface of the second insulating layer PAS2 may contact (e.g., partially contact) the first connection electrode CNE1 and the second insulating layer PAS2. A side surface of the third insulating layer PAS3 in a direction in which the second electrode RME2 is disposed may be aligned with a side surface of the second insulating layer PAS2. For example, the third insulating layer PAS3 may be disposed in the non-emission area, for example, on the first insulating layer PAS1 disposed on the via layer VIA. However, embodiments are not limited thereto.

The second connection electrode CNE2 may be disposed on the second electrode RME2, the second insulating layer PAS2, and the third insulating layer PAS3. The second connection electrode CNE2 may contact another end of each light emitting element ED and the exposed upper surface of the second electrode RME2. Another end of each light emitting element ED may be connected (e.g., electrically connected) to the second electrode RME2 through the second connection electrode CNE2.

The second connection electrode CNE2 may contact (e.g., partially contact) the second insulating layer PAS2, the third insulating layer PAS3, the second electrode RME2, and the light emitting elements ED. The first connection electrode CNE1 and the second connection electrode CNE2 may not contact each other due to the second insulating layer PAS2 and the third insulating layer PAS3. However, embodiments are not limited thereto. In some cases, the third insulating layer PAS3 may be omitted.

A fourth insulating layer PAS4 may be disposed on the third insulating layer PAS3, the second connection electrode CNE2, and the first bank BNL1. The fourth insulating layer PAS4 may be disposed on an upper surface of each of the third insulating layer PAS3, the second connection electrode CNE2, and the first bank BNL1 to cover them.

Each of the first insulating layer PAS1, the second insulating layer PAS2, the third insulating layer PAS3, and the fourth insulating layer PAS4 described above may include an inorganic insulating material or an organic insulating material. In an embodiment, the first insulating layer PAS1, the second insulating layer PAS2, the third insulating layer PAS3, and the fourth insulating layer PAS4 may include an inorganic insulating material such as silicon oxide ($SiO_x$), silicon nitride ($SiN_x$), silicon oxynitride ($SiO_xN_y$), aluminum oxide ($AlO_y$), or aluminum nitride ($AlN_x$). In another example, the first insulating layer PAS1, the second insulating layer PAS2, the third insulating layer PAS3, and the fourth insulating layer PAS4 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, embodiments are not limited thereto.

A second bank BNL2 may be disposed on the fourth insulating layer PAS4. The second bank BNL2 may be disposed (e.g., directly disposed) on an upper surface of the fourth insulating layer PAS4 and may overlap the first bank BNL1. The second bank BNL2 may be disposed in a grid pattern including portions extending in the first direction DR1 and the second direction DR2 in a plan view and may be disposed at the boundary area of each of the subpixels SPX1, SPX2, and SPX3 to separate neighboring subpixels SPX1, SPX2, and SPX3. For example, the second bank BNL2 may surround the emission area EMA and the sub-area SA.

The second bank BNL2 may have a height (e.g., a predetermined height). The second bank BNL2 may prevent ink from overflowing into each adjacent subpixel SPX1, SPX2 or SPX3 in an inkjet printing process during the manufacturing process of the display device 10. The second bank BNL2 may prevent mixing of inks in which different compositions of the wavelength control layer CWL are dispersed for different subpixels SPX1, SPX2, and SPX3. Like the first bank BNL1, the second bank BNL2 may include polyimide, but embodiments are not limited thereto.

The wavelength control layer CWL may be disposed on the light emitting element layer EL. According to an embodiment, the wavelength control layer CWL may be disposed in areas surrounded by the first bank BNL1. The wavelength control layer CWL may be disposed in each of the subpixels SPX1, SPX2, and SPX3. The wavelength control layer CWL may be disposed in the emission area EMA among the areas surrounded by the first bank BNL1 but may not be disposed in (or overlap) the sub-area SA. The wavelength control layer CWL may be disposed in an area surrounded by the first bank BNL1 in an area of the light emitting element layer EL in which the light emitting elements ED are disposed.

In some embodiments, a height of the wavelength control layer CWL may be greater than the height of the second bank BNL2. The wavelength control layer CWL may be formed through an inkjet printing process or a photo process during the manufacturing process of the display device 10. The wavelength control layer CWL may be formed by spraying or applying a material that forms the wavelength control layer CWL into each area surrounded by the second bank BNL2 and performing a drying process or an exposure and development process. For example, the material that forms the wavelength control layer CWL may have viscosity by including an organic material and may not overflow to other subpixels SPX1, SPX2, and SPX3 beyond the second bank BNL2 in case that the organic material is sprayed or applied to a position higher than the second bank BNL2. Accordingly, the height of the wavelength control layer CWL may be greater than that of the second bank BNL2. However, embodiments are not limited thereto.

In an embodiment in which the light emitting element layer EL of each of the subpixels SPX1, SPX2, and SPX3 emits light of the third color, the wavelength control layer CWL may include a first wavelength conversion layer WCL1 disposed in the first subpixel SPX1, a second wavelength conversion layer WCL2 disposed in the second subpixel SPX2, and a light transmitting layer TPL disposed in the third subpixel SPX3.

The first wavelength conversion layer WCL1 may include a first base resin BRS1 and first wavelength conversion materials WCP1 disposed in the first base resin BRS1. The second wavelength conversion layer WCL2 may include a second base resin BRS2 and second wavelength conversion materials WCP2 disposed in the second base resin BRS2. The first wavelength conversion layer WCL1 and the second wavelength conversion layer WCL2 convert the wavelength of light of the third color incident from the light emitting element layer EL and transmit the light having the converted wavelength. Scatterers SCP of the first wavelength conversion layer WCL1 and the second wavelength conversion layer WCL2 may increase wavelength conversion efficiency.

The light transmitting layer TPL may include a third base resin BRS3 and scatterers SCP disposed in the third base resin BSR3. The light transmitting layer TPL transmits the light of the third color incident from the light emitting element layer EL with maintaining the wavelength of the light of the third color. The scatterers SCP of the light transmitting layer TPL may function to control an emission path of light emitted through the light transmitting layer TPL. The light transmitting layer TPL may not include wavelength conversion materials.

The scatterers SCP may have a refractive index different from those of the first, second, and third base resins BRS1, BRS2, and BRS3. The scatterers SCP may be metal oxide particles or organic particles. The metal oxide particles may be, for example, titanium oxide ($TiO_2$), zirconium oxide ($ZrO_2$), aluminum oxide ($Al_2O_3$), indium oxide ($In_2O_3$), zinc oxide ($ZnO_2$), silica, barium sulfate ($BaSO_4$), or tin oxide ($SnO_2$). The organic particles may be, for example, polystyrene or polymethyl methacrylate (PMMA). The scatterers SCP may have a hollow structure, but embodiments are not limited thereto.

The size of the scatterers SCP may be related to the wavelength of light emitted from the light emitting elements ED. For example, in case that the wavelength of light emitted from the light emitting elements ED is $\lambda$, the size of the scatterers SCP may be in a range of about $\lambda/10$ to about $5\lambda$, specifically may be about $\lambda/2$, but embodiments are not limited thereto. For example, in case that light emitted from the light emitting elements ED has a peak wavelength of about 480 nm or less, a peak wavelength of about 445 nm to about 480 nm, the size of the scatterers SCP may be in a range of about 150 nm to about 300 nm.

The first, second, and third base resins BRS1, BRS2, and BRS3 may include a light-transmitting organic material. For example, the first, BRS2, and third base resins BRS1, BRS2, and BRS3 may include epoxy resin, acrylic resin, cardo resin, or imide resin. The first, BRS2, and third base resins BRS1, BRS2, and BRS3 may all be made of the same material, but embodiments are not limited thereto.

The first wavelength conversion materials WCP1 may be materials that convert light of the third color into light of the first color, and the second wavelength conversion materials WCP2 may be materials that convert light of the third color into light of the second color. The first wavelength conversion materials WCP1 and the second wavelength conversion materials WCP2 may be quantum dots, quantum rods, or phosphors.

For example, the first wavelength conversion materials WCP1 may be materials that convert blue light into red light. For example, the second wavelength conversion materials WCP2 may be materials that convert blue light into green light. The first wavelength conversion materials WCP1 and the second wavelength conversion materials WCP2 may be quantum dots (QDs), quantum rods, fluorescent materials, or phosphorescent materials. The quantum dots may include group IV nanocrystals, group II-VI compound nanocrystals, group III-V compound nanocrystals, group IV-VI nanocrystals, or a combination thereof.

Each quantum dot may include a core and a shell surrounding the core. The core may be at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. However, embodiments are not limited thereto. The shell may include at least one of, for example, ZnS, ZnSe, ZnTe, CdS, CdSe, CdTe, HgS, HgSe, HgTe, AN, AlP, AlAs, AlSb, GaN, GaP, GaAs, GaSb, GaSe, InN, InP, InAs, InSb, TlN, TlP, TlAs, TlSb, PbS, PbSe, and PbTe. However, embodiments are not limited thereto.

The fluorescent materials may be inorganic fluorescent materials, and inorganic phosphors such as garnets, silicates, sulfides, oxynitrides, nitrides, and aluminates may be used. The inorganic phosphors may include, but are not limited to, at least one of, for example, $Y_3Al_5O_{12}:Ce^{3+}$ (YAG:Ce), $Tb_3Al_5O_{12}:Ce^{3+}$ (TAG:Ce), $(Sr,Ba,Ca)_2SiO_4:Eu^{2+}$, $(Sr,Ba,Ca,Mg,Zn)_2Si(OD)_4:Eu^{2+}$ D=F,Cl,S,N,Br, $Ba_2MgSi_2O_7:Eu^{2+}$, $Ba_2SiO_4:Eu^{2+}$, $Ca_3(Sc,Mg)_2Si_3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta$-$SiAlON:Eu^{2+}$, Ca-$\alpha$-$SiAlON:Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5Ns:Eu^{2+}$, $(Sr,Ba)Al_2O_4:Eu^{2+}$, $(Mg,Sr)Al_2O_4:Eu^{2+}$, and $BaMg_2Al_{16}O_{27}:Eu^{2+}$. However, embodiments are not limited thereto, and the fluorescent materials may include organic fluorescent materials.

The wavelength control layer CWL may be disposed (e.g., directly disposed) on the light emitting element layers EL. In the display device 10, since the second bank BNL2 has a height (e.g., a predetermined height) and surrounds the subpixels SPX1, SPX2, and SPX3, the base resins BRS1 through BRS3 of the wavelength control layer CWL may be disposed (e.g., directly disposed) on the third insulating layers PAS3 and the second connection electrodes CNE2 of the light emitting element layers EL.

The base resins BRS1 through BRS3 of the wavelength control layer CWL may cover the light emitting elements ED, the bank pattern layers BP, the electrodes RME, and the connection electrodes CNE1 and CNE2 of the light emitting element layers EL in areas surrounded by the second bank BNL2. For example, the scatterers SCP and the wavelength conversion materials WCP1 or WCP2 of the wavelength control layer CWL may be disposed in each of the base resins BRS1 through BRS3 and may be positioned around the light emitting element layer EL.

Light emitted from each light emitting element layer EL may be light of the same third color. Light emitted from the light emitting element layer EL may travel or transmit toward the wavelength control layer CWL. Light of the third color emitted from the light emitting elements ED disposed in the first subpixel SPX1 may be incident on the first wavelength conversion layer WCL1, light of the third color emitted from the light emitting elements ED disposed in the second subpixel SPX2 may be incident on the second wavelength conversion layer WCL2, and light of the third color emitted from the light emitting elements ED disposed in the third subpixel SPX3 may be incident on the light transmitting layer TPL. The light of the third color incident on the first wavelength conversion layer WCL1 may be converted into light of the first color, and the light of the third color incident on the second wavelength conversion layer WCL2 may be converted into light of the second color. The light incident on the light transmitting layer TPL may be transmitted as the light of the same third color without wavelength conversion. Although the subpixels SPX1, SPX2, and SPX3 include the light emitting element layers EL emitting light of the same color, they may display light of different colors according to the arrangement of the wavelength control layer CWL disposed on the light emitting element layers EL.

The passivation layer PRL may be disposed on the wavelength control layer CWL. The passivation layer PRL may protect an underlying structure including the wavelength control layer CWL and may planarize steps. The passivation layer PRL may include a first capping layer CPL1, a low refractive layer LR, and a second capping layer CPL2.

The first capping layer CPL1 may be disposed on the wavelength control layer CWL. The first capping layer CPL1 may be disposed on the second bank BNL2 and the wavelength control layer CWL to cover the second bank BNL2 and the wavelength control layer CWL. The first capping layer CPL1 may be disposed (e.g., entirely disposed) in the display area DPA (see FIG. 1) of the display device 10.

The first capping layer CPL1 may include an inorganic material. For example, the first capping layer CPL1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

Although the first capping layer CPL1 is formed as a single layer in the drawings, embodiments are not limited thereto. For example, the first capping layer CPL1 may be formed as a multilayer in which inorganic layers including at least any one of the materials included in the first capping layer CPL1 are alternately stacked with each other. A thickness of the first capping layer CPL1 may be in a range of about 0.05 μm to about 2 μm, but embodiments are not limited thereto.

The low refractive layer LR may be disposed on the first capping layer CPL1. The low refractive layer LR may be interposed between the first capping layer CPL1 and the second capping layer CPL2. The low refractive layer LR may be disposed (e.g., entirely disposed) in the display area DPA (see FIG. 1) of the display device 10. The low refractive layer LR may be interposed between the wavelength control layer CWL and the color filter layer CFL to planarize a step formed by the wavelength control layer CWL. For example, the low refractive layer LR may be a low refractive index layer that reduces light reflectance.

A refractive index of the low refractive layer LR may be in a relatively low range compared with those of the first capping layer CPL1 and the second capping layer CPL2 constituting the passivation layer PRL. For example, the refractive index of the low refractive layer LR may be in a range of 1.2 to 1.5, but embodiments are not limited thereto.

The low refractive layer LR may include an organic material. For example, the low refractive layer LR may include at least one of acryl resin, epoxy resin, phenolic resin, polyamide resin, and polyimide resin. A thickness of the low refractive layer LR may be in a range of about 0.2 μm to about 10 μm, but embodiments are not limited thereto. The low refractive layer LR may further include particles for lowering the refractive index.

The second capping layer CPL2 may be disposed on the low refractive layer LR. The second capping layer CPL2 may be interposed between the low refractive layer LR and the color filter layer CFL. The second capping layer CPL2 may have substantially the same configuration as the first capping layer CPL1 described above, and thus a description thereof will be omitted for descriptive convenience.

The color filter layer CFL may be disposed on the passivation layer PRL in the display area DPA (see FIG. 1). For example, the color filter layer CFL may be disposed on the second capping layer CPL2 of the passivation layer PRL. The color filter layer CFL may include color filters CF.

The color filter layer CFL may include a first color filter CF1, a second color filter CF2, and a third color filter CF3.

The first color filter CF1 may overlap the emission area EMA of the first subpixel SPX1, the second color filter CF2 may overlap the emission area EMA of the second subpixel SPX2, and the third color filter CF3 may overlap the emission area EMA of the third subpixel SPX3. For example, the first color filter CF1, the second color filter CF2, and the third color filter CF3 may be stacked in the third direction DR3 in the non-emission area NEA of each of the subpixels SPX1, SPX2, and SPX3.

Each of the first, second, and third color filters CF1, CF2, and CF3 may include a colorant such as a dye or pigment that absorbs wavelengths other than a corresponding color wavelength. The first color filter CF1 may selectively transmit light of the first color (e.g., red light) and block or absorb light of the second color (e.g., green light) and light of the third color (e.g., blue light). The second color filter CF2 may selectively transmit light of the second color (e.g., green light) and block or absorb light of the first color (e.g., red light) and light of the third color (e.g., blue light). The third color filter CF3 may selectively transmit light of the third color (e.g., blue light) and block or absorb light of the first color (e.g., red light) and light of the second color (e.g., green light). For example, the first color filter CF1 may be a red color filter, the second color filter CF2 may be a green color filter, and the third color filter CF3 may be a blue color filter.

In an embodiment, light incident on the first color filter CF1 may be light converted into light of the first color by the first wavelength conversion layer WCL1, light incident on the second color filter CF2 may be light converted into light of the second color by the second wavelength conversion layer WCL2, and light incident on the third color filter CF3 may be light of the third color transmitted through the light transmitting layer TPL. Thus, the light of the first color passing through the first color filter CF1, the light of the second color passing through the second color filter CF2, and the light of the third color passing through the third color filter CF3 may be output toward above the first substrate SUB1 to display full-color images.

The first, second, and third color filters CF1, CF2, and CF3 may absorb a portion of light incident from the outside of the display device 10, thereby reducing reflected light due to the external light. Therefore, the first, second, and third color filters CF1, CF2, and CF3 may prevent color distortion due to reflection of external light.

Light of the first color, light of the second color, and light of the third color may all be blocked or absorbed in the non-emission area NEA of each of the subpixels SPX1, SPX2, and SPX3. For example, light of the first color incident on the non-emission area NEA of the first subpixel SPX1 may pass through the first color filter CF1, but may be blocked and absorbed by the second color filter CF2 and the third color filter CF3 disposed on the first color filter CF1. Light of the second color incident on the non-emission area NEA of the second subpixel SPX2 may pass through the second color filter CF2 but may be blocked and absorbed by the first color filter CF1 and the third color filter CF3 disposed on the second color filter CF2. Light of the third color incident on the non-emission area NEA of the third subpixel SPX3 may pass through the third color filter CF3 but may be blocked and absorbed by the first color filter CF1 and the second color filter CF2 disposed on the third color filter CF3.

As described above, the non-emission area NEA of each of the subpixels SPX1, SPX2, and SPX3 may not only block light emission but suppress reflection of external light. The non-emission area NEA of each of the subpixels SPX1, SPX2, and SPX3 may be formed in a grid shape surrounding the emission area EMA in a plan view. In some embodiments, the non-emission area NEA of each of the subpixels SPX1, SPX2, and SPX3 may have a smaller width than the first bank BNL1. However, embodiments are not limited thereto, and the non-emission area NEA of each of the subpixels SPX1, SPX2, and SPX3 may have substantially the same width as the first bank BNL1.

In some embodiments, the area of the emission area EMA may be different in each of the subpixels SPX1, SPX2, and SPX3. For example, the first color filter CF1 including a red colorant may be disposed in the first subpixel SPX1, and the area (or the size) of the first subpixel SPX1 may be larger than the areas (or the sizes) those of the second subpixel SPX2 and the third subpixel SPX3. For example, the second color filter CF2 including a green colorant may be disposed in the second subpixel SPX2, and the area (or the size) of the second subpixel SPX2 may be larger than the area (or the size) of the third subpixel SPX3. However, embodiments are not limited thereto. The area (or the size) of at least any one of the subpixels SPX1, SPX2, and SPX3 may be different from the areas (or the sizes) of another subpixels SPX1, SPX2, and SPX3, and the size relationship between them may be different from that described above. In the display device 10, the area of each of the subpixels SPX1, SPX2, and SPX3 may be designed differently to prevent degradation of display quality of the display device 10 due to reflection of external light.

The color filter layer CFL may be disposed in the emission area EMA in each of the subpixels SPX1, SPX2, and SPX3. Although the color filter layer CFL is disposed in each of the subpixels SPX1, SPX2, and SPX3 to form an island-shaped pattern, embodiments are not limited thereto.

The second substrate SUB2 may be disposed on the color filter layer CFL. The second substrate SUB2 may be an insulating substrate. The second substrate SUB2 may be made of a transparent insulating material such as glass, quartz, or polymer resin. For example, the second substrate SUB2 may be a rigid substrate, but may be a flexible substrate that is bendable, foldable, rollable, etc.

The light emitting elements ED included in the light emitting element layer EL described above may be structured as illustrated in FIG. 6.

Referring to FIG. 6, a light emitting element ED may be a particulate element and may be shaped like a rod or cylinder having an aspect ratio (e.g., a predetermined aspect ratio). The light emitting element ED my have a nanometer-scale size (e.g., 1 nm to less than 1 μm) or a micrometer-scale size (e.g., 1 μm to less than 1 mm). In an embodiment, both the diameter and length of the light emitting element ED may have a nanometer-scale size or a micrometer-scale size. In some other embodiments, the diameter of the light emitting element ED may have a nanometer-scale size, whereas the length of the light emitting element ED has a micrometer-scale size. In some embodiments, some of light emitting elements ED may have a nanometer-scale size in diameter and/or length, whereas the other ones of the light emitting elements ED have a micrometer-scale size in diameter and/or length.

In an embodiment, the light emitting element ED may be an inorganic light emitting diode. For example, the light emitting element ED may include a semiconductor layer doped with impurities of any conductivity type (e.g., a p-type or an n-type). The semiconductor layer may receive an electrical signal from an external power source and emit light of a specific wavelength band.

The light emitting element ED according to an embodiment may include a first semiconductor layer 31, a light emitting layer 33, a second semiconductor layer 32, and an electrode layer 37 sequentially stacked in a longitudinal direction. The light emitting element ED may further include an insulating film 38 covering outer surfaces of the first semiconductor layer 31, the second semiconductor layer 32, and the light emitting layer 33.

The first semiconductor layer 31 may be an n-type semiconductor. In cast that the light emitting element ED emits light in a blue wavelength band, the first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the semiconductor material included in the first semiconductor layer 31 may be any one or more of n-type doped AlGaInN, GaN, AlGaN, InGaN, AlN, and InN. The first semiconductor layer 31 may be doped with an n-type dopant, and the n-type dopant may be Si, Ge, or Sn. For example, the first semiconductor layer 31 may be n-GaN doped with n-type Si. A length of the first semiconductor layer 31 may be in a range of about 1.5 μm to about 5 μm, but embodiments are not limited thereto.

The second semiconductor layer 32 may be disposed on the light emitting layer 33 to be described below. The second semiconductor layer 32 may be a p-type semiconductor. In cast that the light emitting element ED emits light in a blue or green wavelength band, the second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the semiconductor material included in the second semiconductor layer 32 may be any one or more of p-type doped AlGaInN, GaN, AlGaN, InGaN, AlN, and InN. The second semiconductor layer 32 may be doped with a p-type dopant, and the p-type dopant may be Mg, Zn, Ca, Se, or Ba. For example, the second semiconductor layer 32 may be p-GaN doped with p-type Mg. A length of the second semiconductor layer 32 may be in a range of about 0.05 μm to about 0.10 μm, but embodiments are not limited thereto.

Although each of the first semiconductor layer 31 and the second semiconductor layer 32 is composed of a single layer in the drawing, embodiments are not limited thereto. Each of the first semiconductor layer 31 and the second semiconductor layer 32 may include more layers, for example, may further include a clad layer or a tensile strain barrier reducing (TSBR) layer according to the material of the light emitting layer 33.

The light emitting layer 33 may be disposed between the first semiconductor layer 31 and the second semiconductor layer 32. The light emitting layer 33 may include a material having a single or multiple quantum well structure. In case that the light emitting layer 33 includes a material having a multiple quantum well structure, it may have a structure in which quantum layers and well layers are alternately stacked with each other. The light emitting layer 33 may emit light through combination of electron-hole pairs according to electrical signals received through the first semiconductor layer 31 and the second semiconductor layer 32. In cast that the light emitting layer 33 emits light in the blue wavelength band, it may include a material such as AlGaN or AlGaInN. For example, in case that the light emitting layer 33 has a multiple quantum well structure in which a quantum layer and a well layer are alternately stacked, the quantum layer may include a material such as AlGaN or AlGaInN, and the well layer may include a material such as GaN or AlInN. For example, the light emitting layer 33 may include AlGaInN as a quantum layer and AlInN as a well layer to emit blue light whose central wavelength band is in a range of about 450 to about 495 nm as described above.

However, embodiments are not limited thereto, and the light emitting layer 33 may have a structure in which a semiconductor material having a large band gap energy and a semiconductor material having a small band gap energy are alternately stacked or may include different group 3 to 5 semiconductor materials according to the wavelength band of light that it emits. Light emitted from the light emitting layer 33 is not limited to light in the blue wavelength band. In some cases, the light emitting layer 33 may emit light in a red or green wavelength band. A length of the light emitting layer 33 may be in a range of about 0.05 μm to about 0.10 μm, but embodiments are not limited thereto.

Light emitted from the light emitting layer 33 may be radiated or transmitted not only through an outer surface of the light emitting element ED in the longitudinal direction, but through side surfaces (e.g., opposite side surfaces). The direction of light emitted from the light emitting layer 33 is not limited thereto.

The electrode layer 37 may be an ohmic connection electrode. However, embodiments are not limited thereto, and the electrode layer 37 may be a Schottky connection electrode. The light emitting element ED may include at least one electrode layer 37. Although the light emitting element ED includes the electrode layer 37 in FIG. 6, embodiments are not limited thereto. In some cases, the light emitting element ED may include additional electrode layers 37, or the electrode layer 37 may be omitted. The following description of the light emitting element ED may apply equally in case that the light emitting element ED includes a different number of electrode layers 37 or further includes another structure.

In case that the light emitting element ED is connected (e.g., electrically connected) to electrodes or connection electrodes in the display device 10 according to an embodiment, the electrode layer 37 may reduce the resistance between the light emitting element ED and the electrodes or the connection electrodes. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO). For example, the electrode layer 37 may include an n-type or p-type doped semiconductor material. The electrode layer 37 may include the same material or different materials, but embodiments are not limited thereto.

The insulating film 38 may surround outer surfaces of the semiconductor layers and the electrode layer described above. For example, the insulating film 38 may surround the outer surface of at least the light emitting layer 33 and extend in the direction in which the light emitting element ED extends. The insulating film 38 may protect the above members. The insulating film 38 may surround side surfaces of the above members but may expose ends (e.g., opposite ends) of the light emitting element ED in the longitudinal direction.

In the drawing, the insulating film 38 may extend in the longitudinal direction of the light emitting element ED to cover from side surfaces of the first semiconductor layer 31 to side surfaces of the electrode layer 37. However, embodiments are not limited thereto, and the insulating film 38 may cover outer surfaces of the light emitting layer 33 and only some semiconductor layers or may cover only a portion of an outer surface of the electrode layer 37 to expose (e.g., partially expose) the outer surface of the electrode layer 37. For example, an upper surface of the insulating film 38 may be rounded in cross section in an area adjacent to at least one end of the light emitting element ED.

A thickness of the insulating film 38 may be in a range of about 10 nm to about 1.0 μm, but embodiments are not limited thereto. The thickness of the insulating film 38 may be, for example, about 40 nm.

The insulating film 38 may include an insulating material such as silicon oxide ($SiO_x$), silicon nitride ($SiN_x$), silicon oxynitride ($SiO_xN_y$), aluminum nitride (AlN), or aluminum oxide ($Al_xO_y$). Accordingly, it may prevent an electrical short circuit that occurs in case that the light emitting layer 33 contacts (e.g., directly contacts) an electrode that transmits an electrical signal to the light emitting element ED. For example, since the insulating film 38 protects the outer surface of the light emitting element ED including the light emitting layer 33, a reduction in luminous efficiency may be prevented.

For example, an outer surface of the insulating film 38 may be treated. The light emitting element ED dispersed in an ink (e.g., a predetermined ink) may be sprayed onto electrodes and aligned. For example, the surface of the insulating film 38 may be hydrophobic or hydrophilic-treated so that the light emitting element ED may be kept separate in the ink without being agglomerated with other adjacent light emitting elements ED. For example, the outer surface of the insulating film 38 may be treated with a material such as stearic acid or 2,3-naphthalene dicarboxylic acid.

In the display device 10 described above, the first substrate SUB1 and the second substrate SUB2 may be bonded to each other through a seal member SEA. For example, the seal member SEA may be disposed between the color filter layer CFL disposed in the non-display area NDA of the first substrate SUB1 and the second substrate SUB2 to bond them together. However, since the color filter layer CFL disposed under the seal member SEA is made of an organic material, external moisture and air may be introduced (or permeated) through the seal member SEA and the color filter layer CFL. The moisture and air introduced (or permeated)

into the display device 10 may reduce the life or durability of the light emitting elements ED. Therefore, in the display device 10 according to an embodiment disclosed below, the reliability of the display device 10 may be improved by improving the adhesion of the seal member SEA to block a penetration path of external air.

Figure 7:
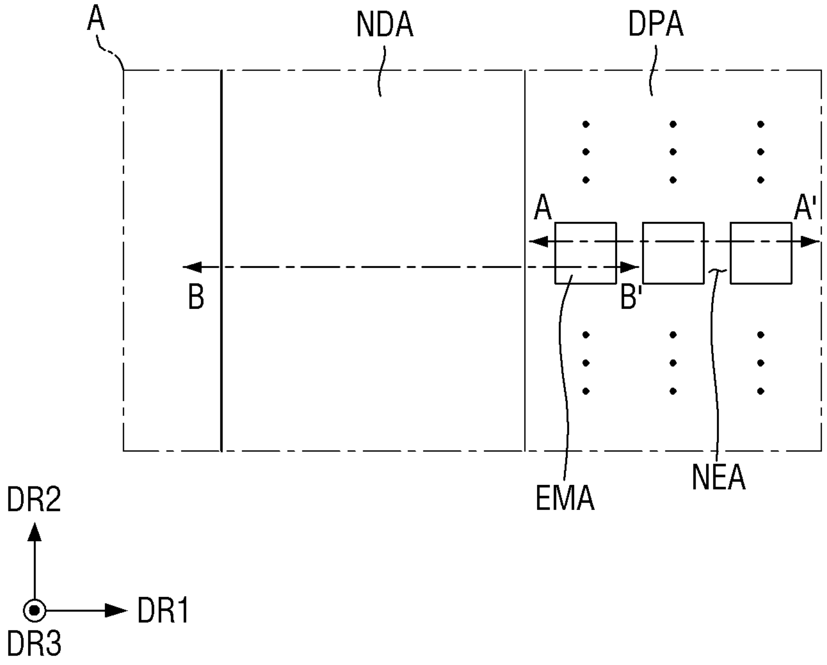
FIG. 7 is a schematic enlarged plan view of area A of FIG. 1.
Figure 8:
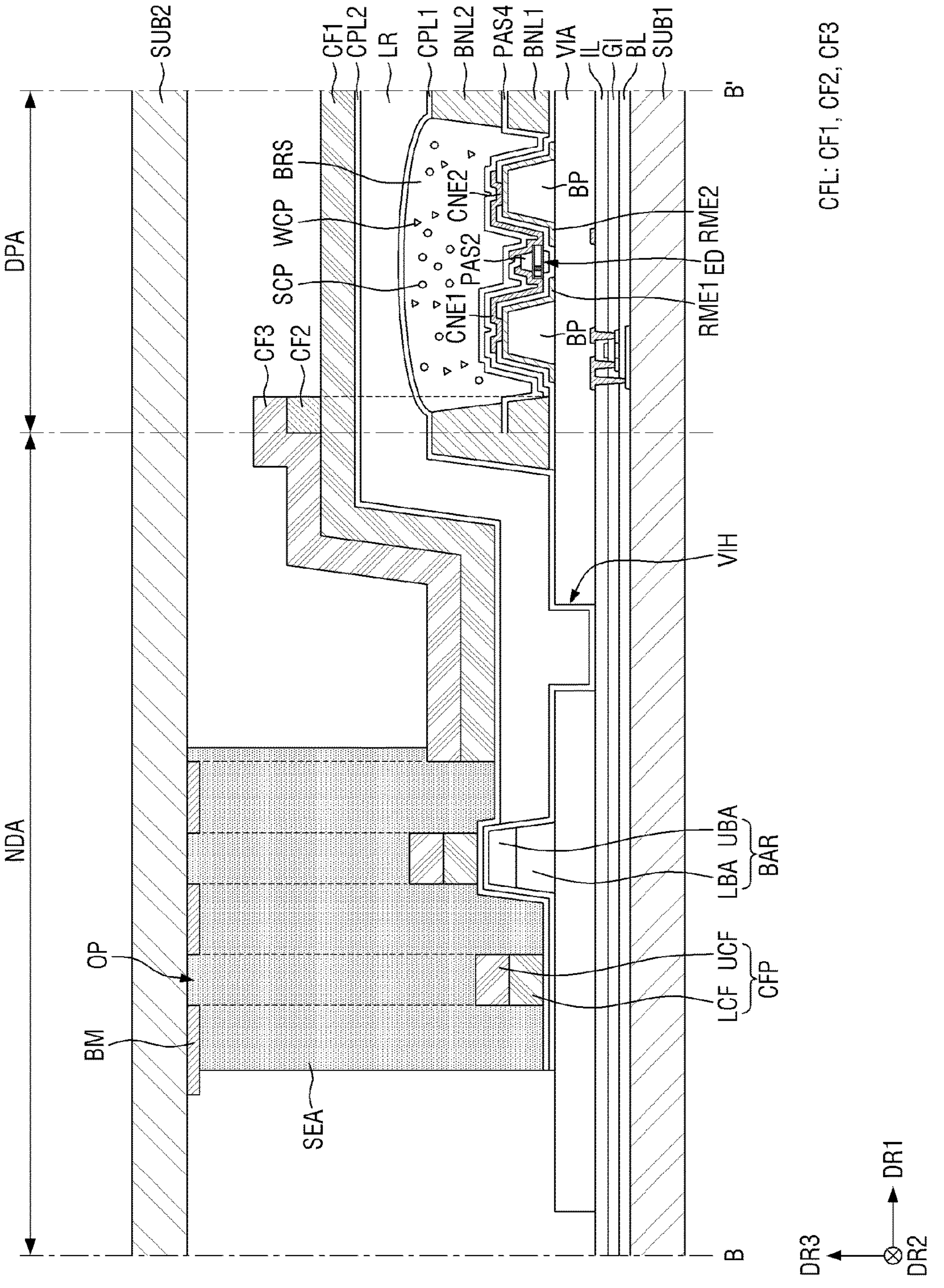
FIG. 8 is a schematic cross-sectional view taken along line B-B' of FIG. 7.
Figure 9:
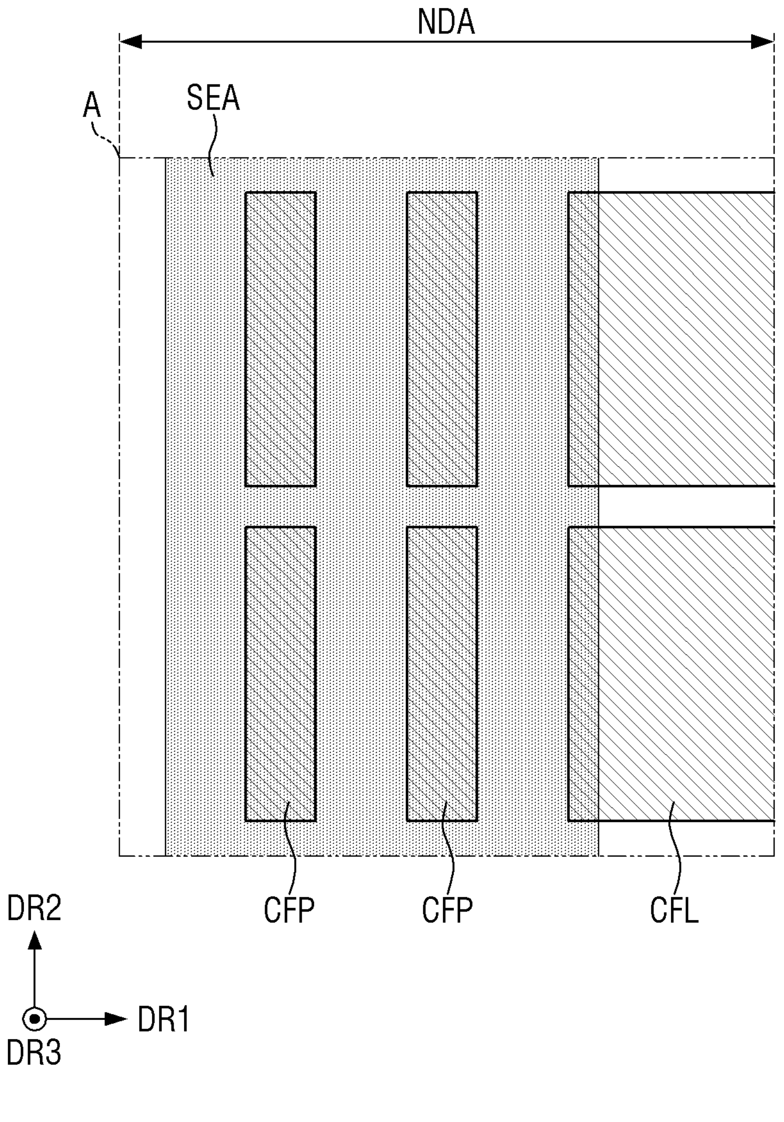
FIG. 9 is a schematic plan view illustrating color filter pattern layers and a seal member in area A of FIG. 7.
Figure 10:
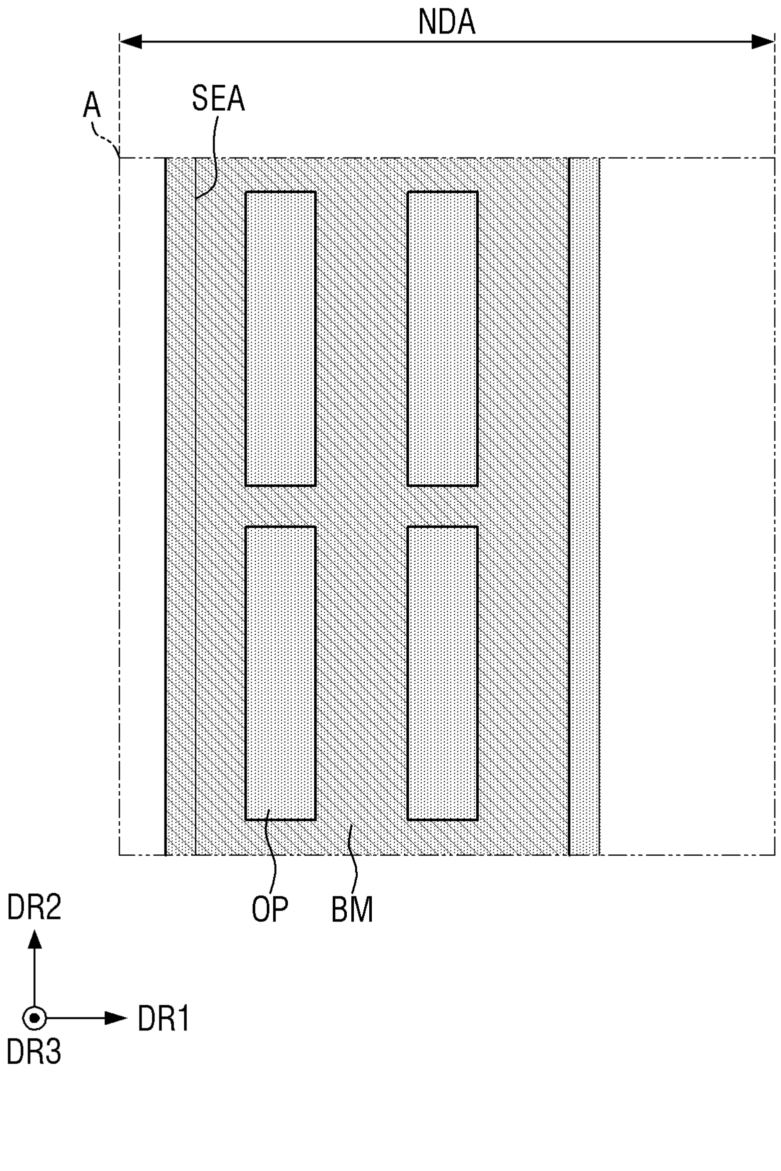
FIG. 10 is a schematic plan view illustrating a light blocking member and the seal member in area A of FIG. 7.
Figure 11:
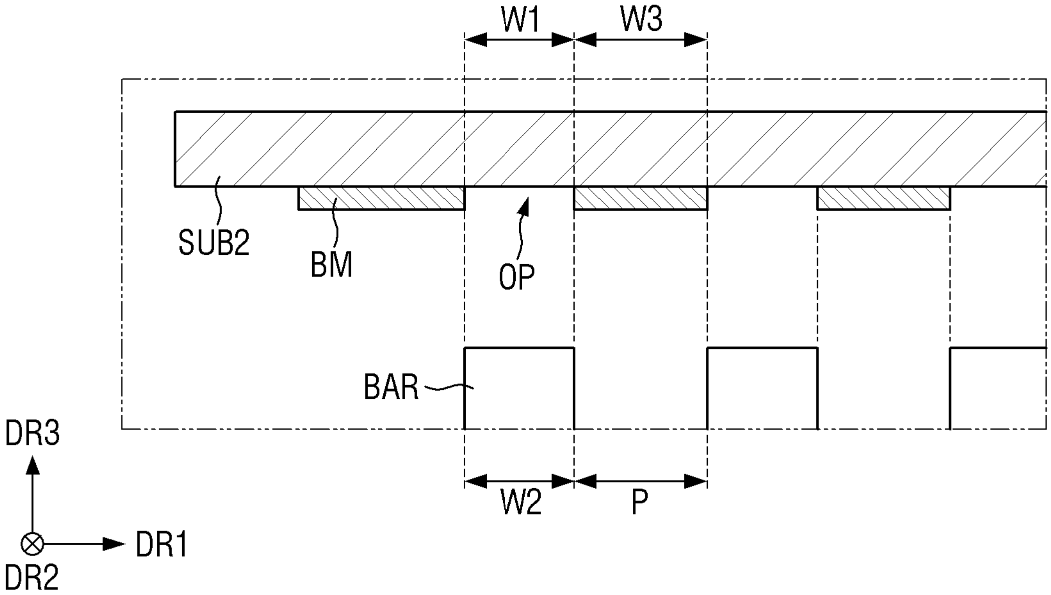
FIG. 11 is a cross-sectional view schematically illustrating an overlapping structure of the light blocking member and the color filter pattern layers of the display device according to an embodiment.

FIG. 7 is a schematic enlarged plan view of area A of FIG. 1. FIG. 8 is a schematic cross-sectional view taken along line B-B' of FIG. 7. FIG. 9 is a schematic plan view illustrating color filter pattern layers CFP and the seal member SEA in area A of FIG. 7. FIG. 10 is a schematic plan view illustrating a light blocking member BM and the seal member SEA in area A of FIG. 7. FIG. 11 is a schematic cross-sectional view schematically illustrating an overlapping structure of the light blocking member BM and the barrier ribs BAR of the display device 10 according to an embodiment.

Referring to FIGS. 7 and 8, inorganic layers and organic layers extending from the display area DPA may be disposed in the non-display area NDA of the display device 10. For example, the buffer layer BL, the gate insulating layer GI, the interlayer insulating layer IL, the via layer VIA, the first capping layer CPL1, the low refractive layer LR, and the second capping layer CPL2 may extend on the first substrate SUB1 of the non-display area NDA.

The via layer VIA may include a via hole VIH exposing a portion of the interlayer insulating layer IL disposed under the via layer VIA. The via hole VIH may surround the display area DPA to cut off the via layer VIA which is an organic layer. For example, the via hole VIH may be shaped like a closed loop in a plan view. The first capping layer CPL1 disposed on the via layer VIA may contact (e.g., directly contact) the interlayer insulating layer IL through the via hole VIH. The first capping layer CPL1 may cover side surfaces of the via layer VIA through the via hole VIH, thereby preventing the via layer VIA from acting as a moisture penetration path.

For example, a barrier rib BAR may be disposed on the via layer VIA. The barrier rib BAR may prevent the low refractive layer LR from overflowing to the periphery of the first substrate SUB1 in case that the low refractive layer LR is applied. The barrier rib BAR may surround the display area DPA, for example, may be shaped like a closed loop shape in a plan view. However, embodiments are not limited thereto. The barrier rib BAR may be covered by the first capping layer CPL1 and may be disposed (e.g., directly disposed) on the upper surface of the via layer VIA.

The barrier rib BAR may include a lower barrier rib layer LBA and an upper barrier rib layer UBA disposed on the lower barrier rib layer LBA. The lower barrier rib layer LBA and the bank pattern layers BP (see FIG. 4) of the display area DPA may include (or be formed of) a same material. For example, the lower barrier rib layer LBA and the bank pattern layers BP may have a same height. The upper barrier rib layer UBA and the first bank BNL1 (see FIG. 4) of the display area DPA may include (or be formed of) a same material. For example, the upper barrier rib layer UBA and the first bank BNL1 may have a same height.

The low refractive layer LR may be disposed on the first capping layer CPL1. The low refractive layer LR may extend from the display area DPA to the barrier rib BAR disposed in the non-display area NDA. The low refractive layer LR may be disposed (e.g., directly disposed) on the first capping layer CPL1 and may planarize a step of the via hole VIH.

The second capping layer CPL2 may be disposed on the low refractive layer LR and the first capping layer CPL1. The second capping layer CPL2 may be disposed (e.g., directly disposed) on the low refractive layer LR and may be disposed (e.g., directly disposed) on the first capping layer CPL1 in an area where the low refractive layer LR is not disposed.

In FIG. 8, the first capping layer CPL1 and the second capping layer CPL2 described above are formed to an area spaced apart from a side surface of the via layer VIA toward the display area DPA. However, embodiments are not limited thereto, and the first capping layer CPL1 and the second capping layer CPL2 may coincide with the side surface of the via layer VIA.

Referring to FIGS. 8, 9 and 10, the color filter layer CFL and color filter pattern layers CFP may be disposed on the second capping layer CPL2 in the non-display area NDA of the display device 10. For example, the color filter layer CFL may be defined as a portion extending from the display area DPA, and the color filter pattern layers CFP may be defined as pattern layers spaced apart from the color filter layer CFL in the non-display area NDA.

The color filter layer CFL may extend from the display area DPA to the non-display area NDA. The color filter layer CFL may be disposed (e.g., directly disposed) on the second capping layer CPL2 to contact the second capping layer CPL2. The color filter layer CFL may overlap the via hole VIH and may not overlap the barrier rib BAR.

Color filters may be stacked in the color filter layer CFL. For example, the color filter layer CFL may have a two-layer structure, and the first color filter CF1 and the third color filter CF3 may be stacked with each other. The first color filter CF1 may be disposed (e.g., directly disposed) on the second capping layer CPL2, and the third color filter CF3 may be disposed (e.g., directly disposed) on the first color filter CF1.

As illustrated in FIGS. 8 and 9, the color filter pattern layers CFP may be spaced apart from the color filter layer CFL. The color filter pattern layers CFP may be disposed (e.g., directly disposed) on the second capping layer CPL2 to contact the second capping layer CPL2. The color filter pattern layers CFP may be shaped like islands in a plan view. The color filter pattern layers CFP adjacent to each other may be spaced apart from each other. In an area where the color filter pattern layers CFP are spaced apart from each other, the second capping layer CPL2 disposed under the color filter pattern layers CFP may be exposed.

Each of the color filter pattern layers CFP may include a lower pattern layer LCF and an upper pattern layer UCF disposed on the lower pattern layer LCF. The lower pattern layer LCF and the first color filter CF1 may include (or be formed of) a same material. For example, the lower pattern layer LCF and the first color filter CF1 may have a same height. The upper pattern layer UCF and the third color filter CF3 may include (or be formed of) a same material. For example, the upper pattern layer UCF and the third color filter CF3 may have a same height. For example, each color filter pattern layer CFP may have a structure in which the first color filter CF1 and the third color filter CF3 are stacked with each other. The lower pattern layer LCF may be disposed (e.g., directly disposed) on the second capping layer CPL2 to contact the second capping layer CPL2. The upper pattern layer UCF may be disposed (e.g., directly disposed) on the lower pattern layer LCF to contact the lower pattern layer LCF. The lower pattern layer LCF and the upper pattern layer UCF may have the same planar size and may overlap (e.g., completely overlap) each other. For example, side surfaces of the lower pattern layer LCF and side surfaces of the upper pattern layer UCF may be aligned with each other.

In FIG. 8, the color filter layer CFL and the color filter pattern layers CFP have a structure in which the first color filter CF1 and the third color filter CF3 are stacked, but embodiments are not limited thereto. The color filter layer CFL and the color filter pattern layers CFP may have a structure in which the first color filter CF1 and the second color filter CF2 are stacked or a structure in which the second color filter CF2 and the third color filter CF3 are stacked with each other.

As illustrated in FIGS. 8 and 10, the light blocking member BM may be disposed on a surface of the second substrate SUB2. The light blocking member BM may overlap the non-display area NDA and may be disposed (e.g., directly disposed) on a surface of the second substrate SUB2 which faces the first substrate SUB1. The light blocking member BM may not only block light emission but suppress reflection of external light. The light blocking member BM may be formed in a grid shape including openings OP in a plan view. The openings OP may be shaped like, for example, slits. The light blocking member BM may include an organic material. In an embodiment, the light blocking member BM may include a light absorbing material that absorbs a visible light wavelength band.

In an embodiment, the light blocking member BM may not overlap the color filter pattern layers CFP. For example, a planar layout of the light blocking member BM may have a shape opposite (or exclusive) to that of a planar layout of the color filter pattern layers CFP. As illustrated in FIGS. 9 and 10, the openings OP of the light blocking member BM may have the same planar shape as the color filter pattern layers CFP and may overlap the color filter pattern layers CFP in the third direction DR3. This will be described in detail below.

The seal member SEA may be disposed between the first substrate SUB1 and the second substrate SUB2 in the non-display area NDA. The seal member SEA may overlap the non-display area NDA of the first substrate SUB1 or the second substrate SUB2 and may adhere and bond the first substrate SUB1 and the second substrate SUB2 to each other. The seal member SEA may include an organic material, for example, a sealant.

The seal member SEA may be disposed on the second capping layer CPL2, the color filter layer CFL, and the color filter pattern layers CFP. The seal member SEA may be disposed (e.g., directly disposed) on the color filter pattern layers CFP to contact the color filter pattern layers CFP. The seal member SEA may cover the color filter pattern layers CFP to contact upper and side surfaces of the color filter pattern layers CFP. For example, the seal member SEA may be disposed (e.g., directly disposed) on the color filter layer CFL to contact the color filter layer CFL. The seal member SEA may cover and contact a portion of an upper surface and side surfaces of the color filter layer CFL.

In an embodiment, the seal member SEA may contact (e.g., directly contact) the second capping layer CPL2. The seal member SEA may contact the second capping layer CPL2 in the area where the color filter pattern layers CFP are spaced apart from each other. For example, the seal member SEA may be disposed between the color filter pattern layers CFP to fill a space between the color filter pattern layers CFP. Accordingly, the seal member SEA may contact (e.g., directly contact) the second capping layer CFPL2 exposed between the color filter pattern layers CFP.

In an embodiment, since the color filter pattern layers CFP spaced apart from each other are formed, the second capping layer CPL2 disposed under the color filter pattern layers CFP may be exposed. Accordingly, since the seal member SEA contacts the second capping layer CPL2 which is an inorganic layer, the adhesion of the seal member SEA may be improved, thereby improving the reliability of the display device 10.

For example, the seal member SEA may contact (e.g., directly contact) the second substrate SUB2 and the light blocking member BM. The seal member SEA may cover the light blocking member BM and may contact (e.g., directly contact) a lower surface of the second substrate SUB2 exposed by the openings OP of the light blocking member BM. Accordingly, since the seal member SEA contacts (e.g., directly contacts) the second substrate SUB2 which is an inorganic material, the adhesion of the seal member SEA may be improved, thereby improving the reliability of the display device 10.

The openings OP disposed in the light blocking member BM may function as regions through which light for photocuring the seal member SEA under the openings OP is transmitted. In case that external light is incident on the openings OP, the external light may be reflected by a structure disposed on the first substrate SUB1. Thus, the non-display area NDA may be viewed or recognized.

In an embodiment, in order to prevent the non-display area NDA from being recognized by a user, the planar layout of the color filter pattern layers CFP may have a shape opposite (or exclusive) to that of the planar layout of the light blocking member BM.

As illustrated in FIGS. 9 and 10, in an embodiment, the planar layout of the light blocking member BM may have a shape opposite (or exclusive) to that of the planar layout of the color filter pattern layers CFP. For example, in case that the planar layout of the light blocking member BM has a donut shape, the planar layout of the color filter pattern layers CFP may have an empty circular shape in the middle of the donut shape.

For example, referring to FIG. 11, in an embodiment, the light blocking member BM and the color filter pattern layers CFP may not overlap each other in the third direction DR3. For example, a side surface of the light blocking member BM may be aligned with a side surface of each color filter pattern layer CFP in the third direction DR3.

For example, the openings OP of the light blocking member BM may overlap the color filter pattern layers CFP in the third direction DR3. For example, the openings OP of the light blocking member BM may overlap (e.g., completely overlap) the color filter pattern layers CFP. A width W1 of each opening OP may be the same as a width W2 of each color filter pattern layer CFP.

For example, the light blocking member BM may overlap a gap P between the color filter pattern layers CFP in the third direction DR3. For example, the light blocking member BM may overlap (e.g., completely overlap) the gap P between the color filter pattern layers CFP. A width W3 of the light blocking member BM may be substantially equal to the gap P between the color filter pattern layers CFP.

The planar layout of the light blocking member BM and the planar layout of the color filter pattern layers CFP described above may be formed in various ways.

Figure 12:
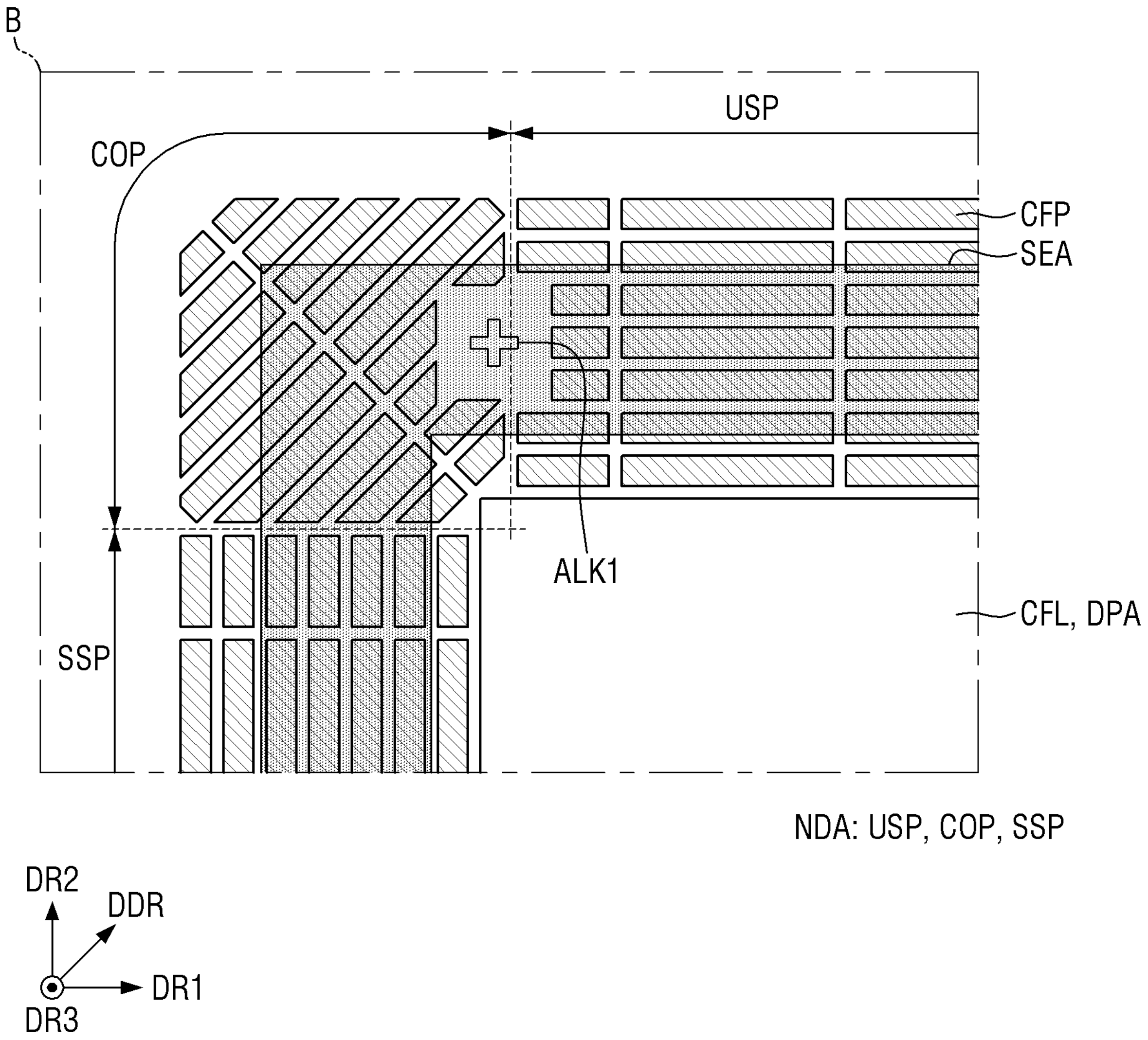
FIG. 12 illustrates an example of a planar layout of the color filter pattern layers in area B of FIG. 1.
Figure 13:
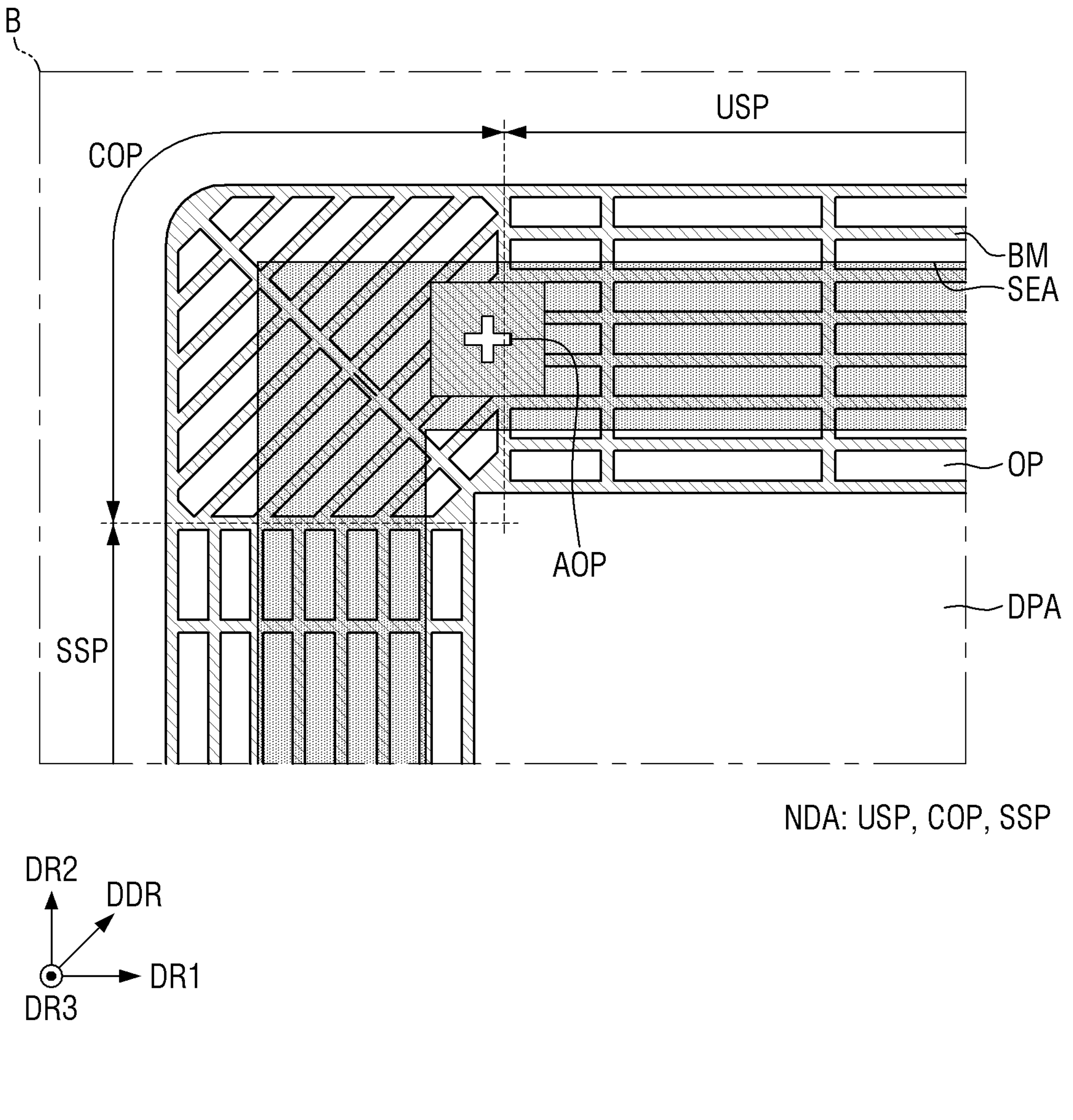
FIG. 13 illustrates an example of a planar layout of the light blocking member in area B of FIG. 1.
Figure 14:
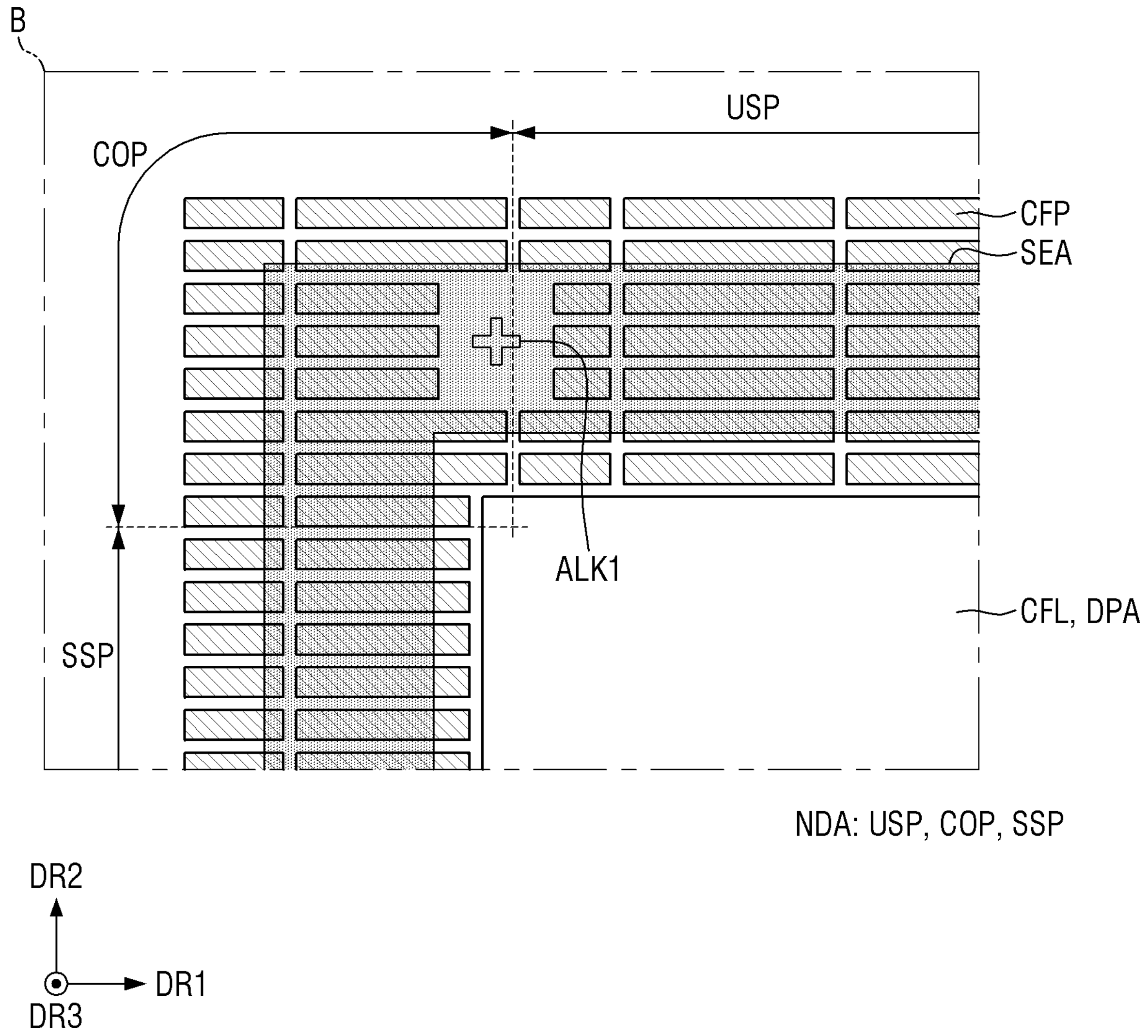
FIG. 14 illustrates an example of the planar layout of the color filter pattern layers in area B of FIG. 1.
Figure 15:
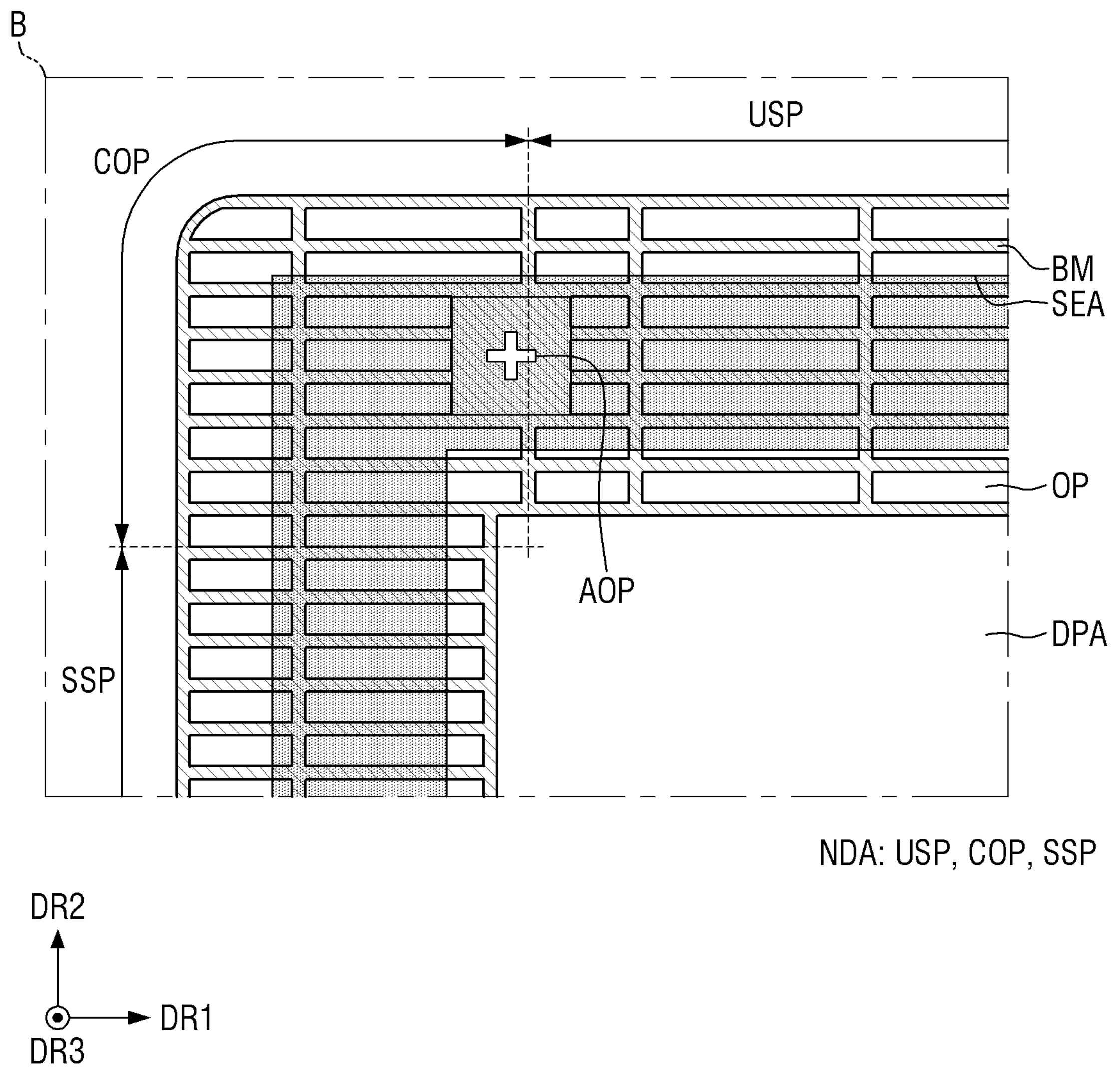
FIG. 15 illustrates an example of the planar layout of the light blocking member in area B of FIG. 1.
Figure 16:
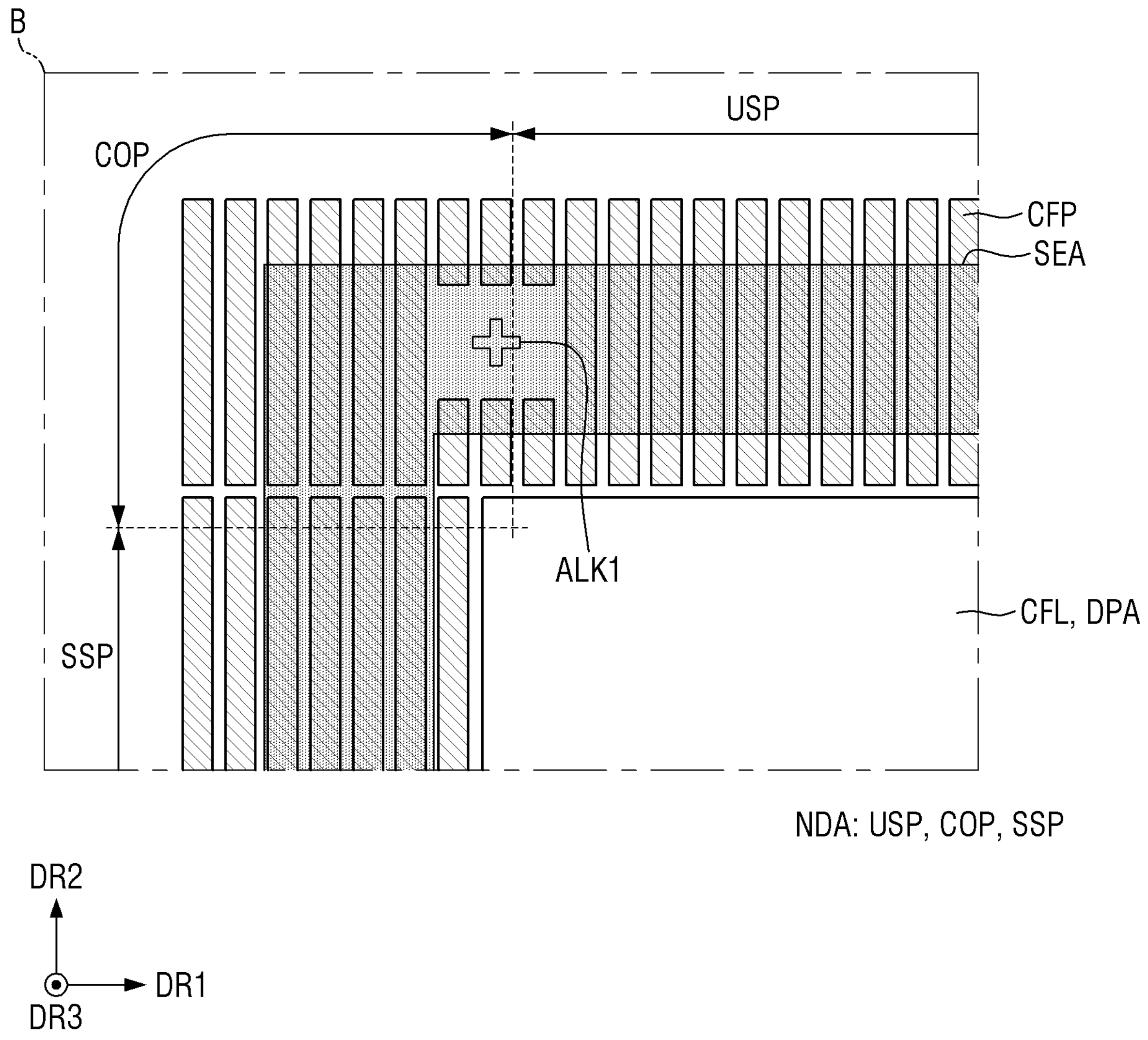
FIG. 16 illustrates an example of the planar layout of the color filter pattern layers in area B of FIG. 1.
Figure 17:
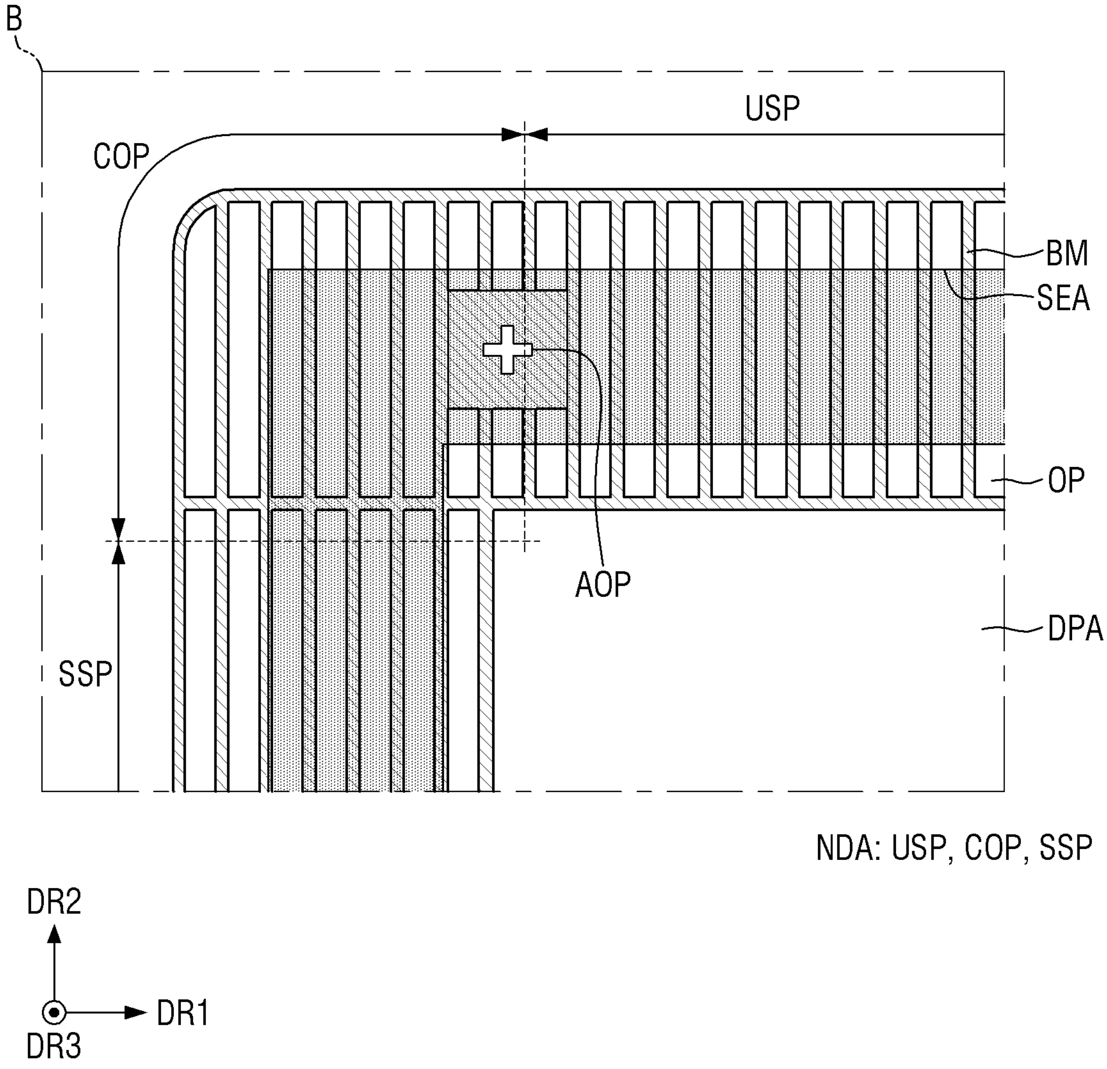
FIG. 17 illustrates an example of the planar layout of the light blocking member in area B of FIG. 1.
Figure 18:
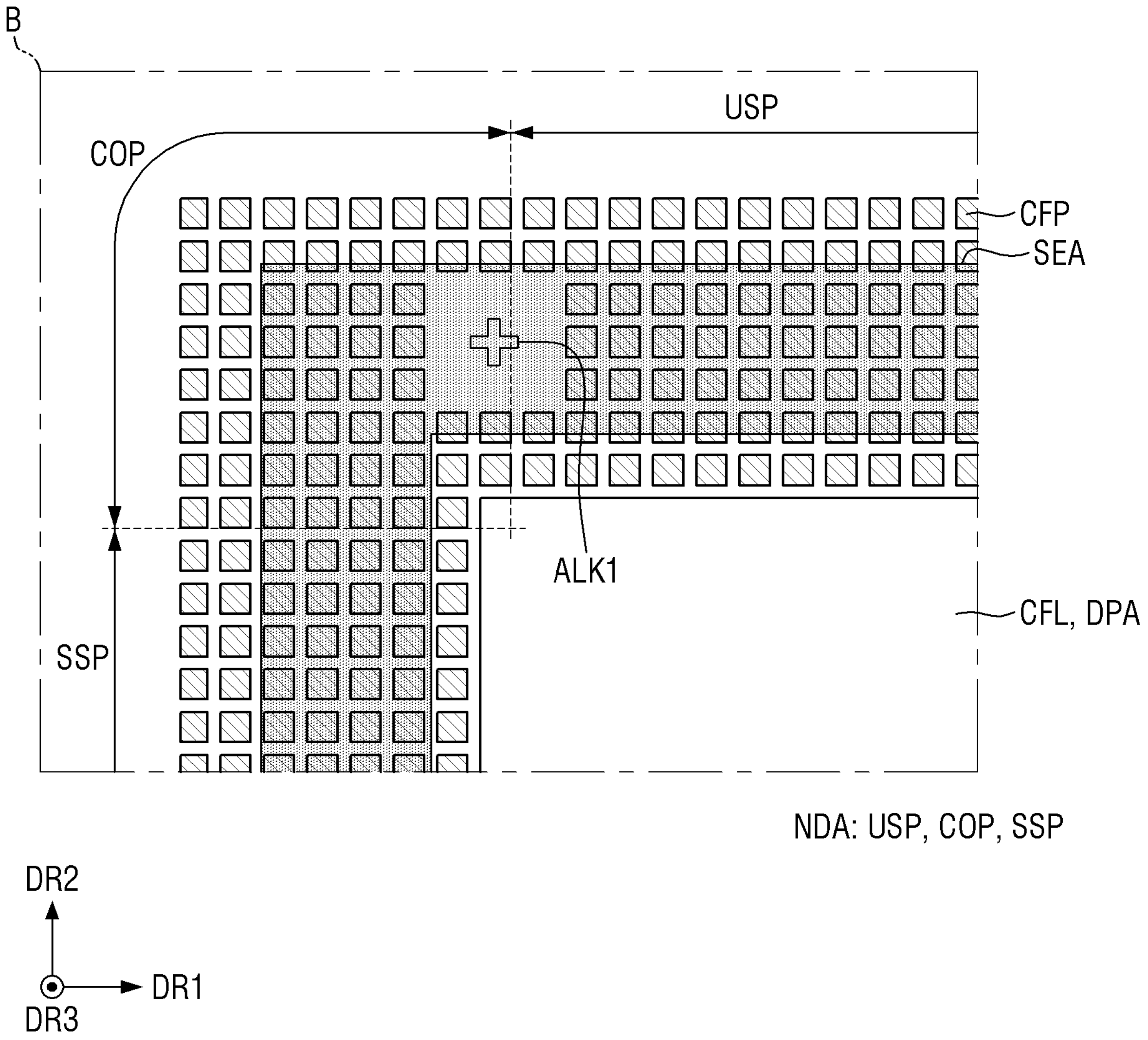
FIG. 18 illustrates an example of the planar layout of the color filter pattern layers in area B of FIG. 1.
Figure 19:
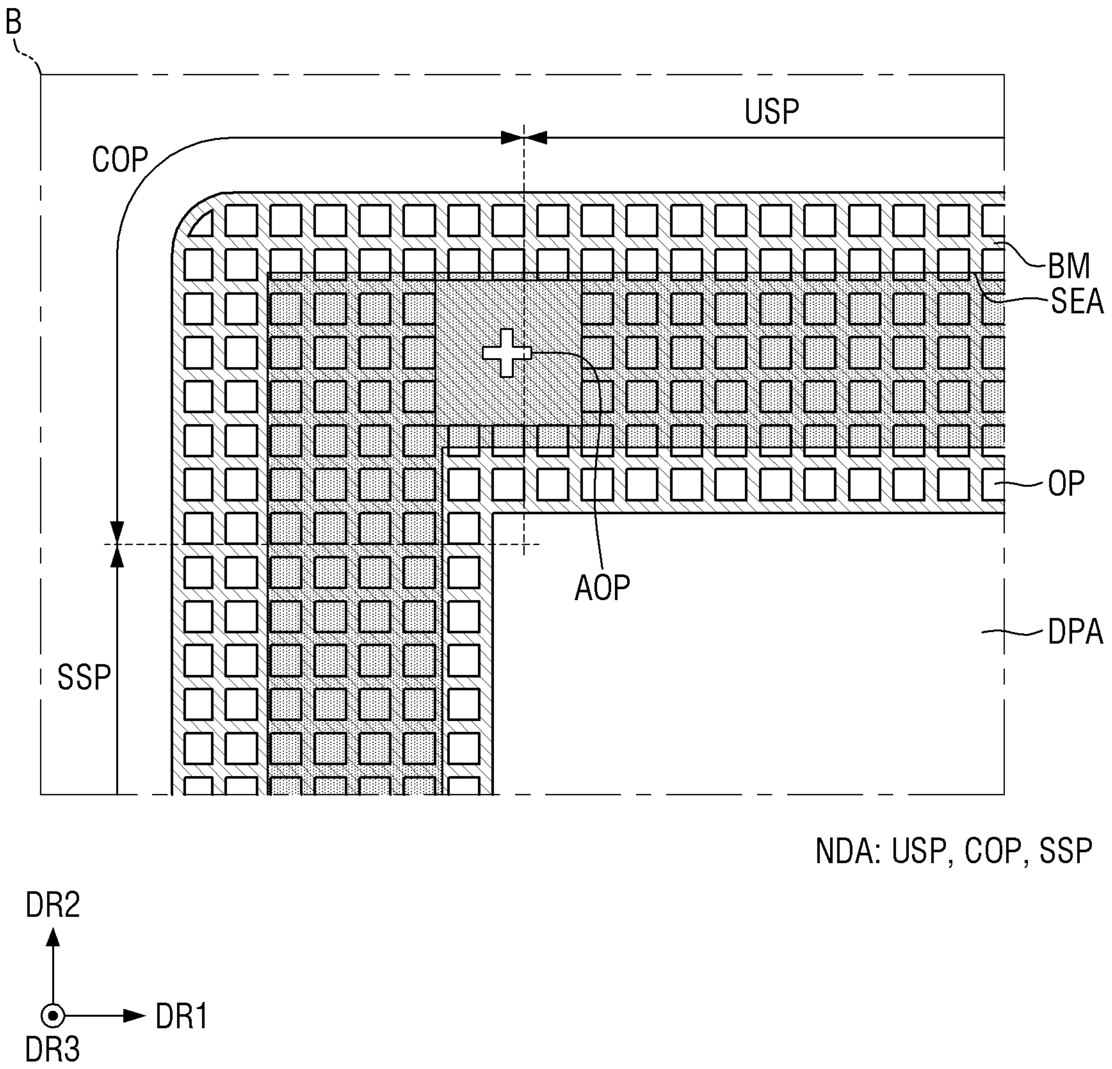
FIG. 19 illustrates an example of the planar layout of the light blocking member in area B of FIG. 1.

FIG. 12 illustrates an example of the planar layout of the color filter pattern layers CFP in area B of FIG. 1. FIG. 13 illustrates an example of the planar layout of the light blocking member BM in area B of FIG. 1. FIG. 14 illustrates an example of the planar layout of the color filter pattern layers CFP in area B of FIG. 1. FIG. 15 illustrates an example of the planar layout of the light blocking member BM in area B of FIG. 1. FIG. 16 illustrates an example of the planar layout of the color filter pattern layers CFP in area B of FIG. 1. FIG. 17 illustrates an example of the planar layout of the light blocking member BM in area B of FIG. 1. FIG. 18 illustrates an example of the planar layout of the color filter pattern layers CFP in area B of FIG. 1. FIG. 19 illustrates an example of the planar layout of the light blocking member BM in area B of FIG. 1.

Referring to FIG. 12, the non-display area NDA of the display device 10 may include a first area USP disposed on a side of the display area DPA, a second area SSP intersecting the first area USP, and a third area COP disposed between the first area USP and the second area SSP. The first area USP may be an area disposed adjacent to upper and lower sides of the display area DPA, the second area SSP may be an area disposed adjacent to lateral sides (e.g., left and right sides) of the display area DPA, and the third area COP may be an area disposed at each corner of the display area DPA.

The color filter pattern layers CFP may be disposed in each of the first area USP, the second area SSP, and the third area COP. The color filter pattern layers CFP disposed in the first area USP may extend in a direction (e.g., the first direction DR1) parallel to the upper side of the display area DPA. The color filter pattern layers CFP disposed in the second area SSP may extend in a direction (e.g., the second direction DR2) parallel to a lateral side of the display area DPA. For example, the color filter pattern layers CFP disposed in the second area SSP may extend in a direction intersecting the upper side of the display area DPA. The color filter pattern layers CFP disposed in the third area COP may be disposed in a direction intersecting the upper side and the lateral side of the display area DPA (e.g., in a diagonal direction DDR between the first direction DR1 and the second direction DR2). For example, the color filter pattern layers CFP disposed in the third area COP may extend in a direction intersecting the directions in which the color filter pattern layers CFP disposed in the first area USP and the second area SSP extend (e.g., in a diagonal direction DDR between the first direction DR1 and the second direction DR2). In an embodiment, the color filter pattern layers CFP disposed in the third area COP may be disposed in a diagonal direction DDR inclined at 45 degrees with respect to the upper side of the display area DPA.

A first alignment pattern mark ALK1 may be disposed over the first area USP and the third area COP. The first alignment pattern mark ALK1 and the color filter pattern layers CFP may have the same stacked structure. The first alignment pattern mark ALK1 may be spaced apart from the color filter pattern layers CFP and may have a cross shape. However, embodiments are not limited thereto, and the first alignment pattern mark ALK1 may have various planar shapes such as a square or a circle.

Referring to FIG. 13, the planar layout of the light blocking member BM may have a shape opposite (or exclusive) to that of the planar layout of the color filter pattern layers CFP. The light blocking member BM including the openings OP may be disposed in the first area USP, the second area SSP, and the third area COP. The openings OP may overlap the color filter pattern layers CFP described above.

For example, the openings OP of the light blocking member BM disposed in the first area USP may extend in the direction (e.g., the first direction DR1) parallel to the upper side of the display area DPA. The openings OP of the light blocking member BM disposed in the second area SSP may extend in the direction (e.g., the second direction DR2) parallel to a lateral side of the display area DPA. For example, the openings OP of the light blocking member BM disposed in the second area SSP may extend in the direction intersecting the upper side of the display area DPA. The openings OP of the light blocking member BM disposed in the third area COP may be disposed in the direction intersecting the upper side and the lateral side of the display area DPA. For example, the openings OP of the light blocking member BM disposed in the third area COP may extend in the direction intersecting the directions in which the openings OP disposed in the first area USP and the second area SSP extend (e.g., in a diagonal direction DDR between the first direction DR1 and the second direction DR2). In an embodiment, the openings OP disposed in the third area COP may be disposed in the direction inclined at 45 degrees with respect to the upper side of the display area DPA.

An alignment opening AOP may be disposed over the first area USP and the third area COP. The alignment opening AOP may overlap the first alignment pattern mark ALK1 in the third direction DR3. The alignment opening AOP may have the same planar shape as the first alignment pattern mark ALK1.

Referring to FIGS. 14 and 15, in an embodiment, the color filter pattern layers CFP disposed in the first area USP, the second area SSP, and the third area COP may extend in the direction (e.g., the first direction DR1) parallel to the upper side of the display area DPA. The openings OP of the light blocking member BM disposed in the first area USP, the second area SSP, and the third area COP may overlap the color filter pattern layers CFP and may extend in the direction (e.g., the first direction DR1) parallel to the upper side of the display area DPA.

Referring to FIGS. 16 and 17, in an embodiment, the color filter pattern layers CFP disposed in the first area USP, the second area SSP, and the third area COP may extend in the direction (e.g., the second direction DR2) parallel to a lateral side of the display area DPA. For example, the color filter pattern layers CFP may extend in the direction intersecting the upper side of the display area DPA. The openings OP of the light blocking member BM disposed in the first area USP, the second area SSP, and the third area COP may overlap the color filter pattern layers CFP and may extend in the direction (e.g., the second direction DR2) parallel to the lateral side of the display area DPA.

Referring to FIGS. 18 and 19, in an embodiment, the color filter pattern layers CFP disposed in the first area USP, the second area SSP, and the third area COP may be disposed in a dot shape or a matrix shape. The openings OP of the light blocking member BM disposed in the first area USP, the second area SSP, and the third area COP may overlap the color filter pattern layers CFP and may be disposed in a dot shape or a matrix shape.

As described above, since the planar layout of the light blocking member BM and the planar layout of the color filter pattern layers CFP have opposite shapes, it is possible to prevent external light from being reflected by the non-display area NDA and thus recognized by a user.

Figure 20:
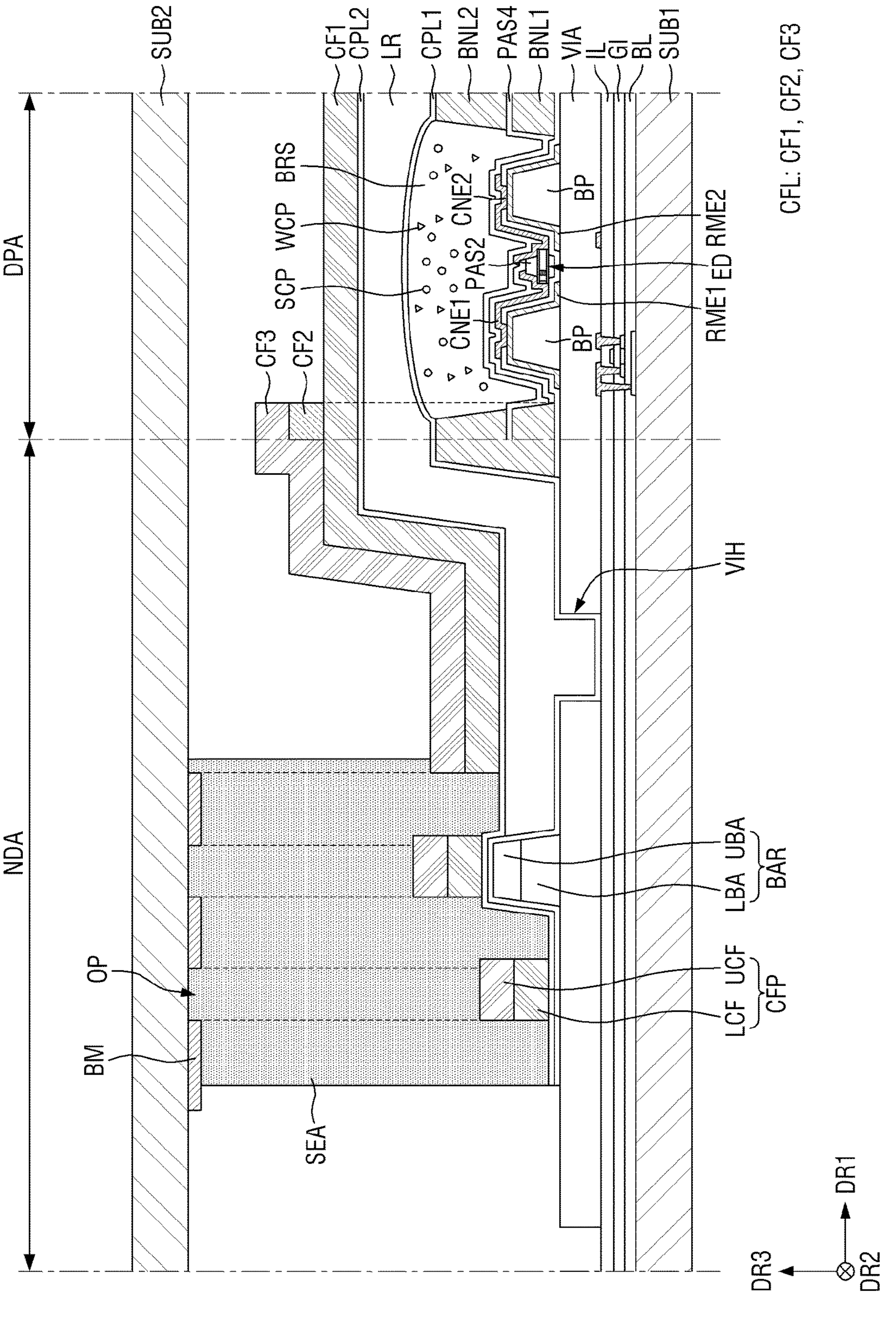
FIG. 20 is a schematic cross-sectional view of a display device according to an embodiment.
Figure 21:
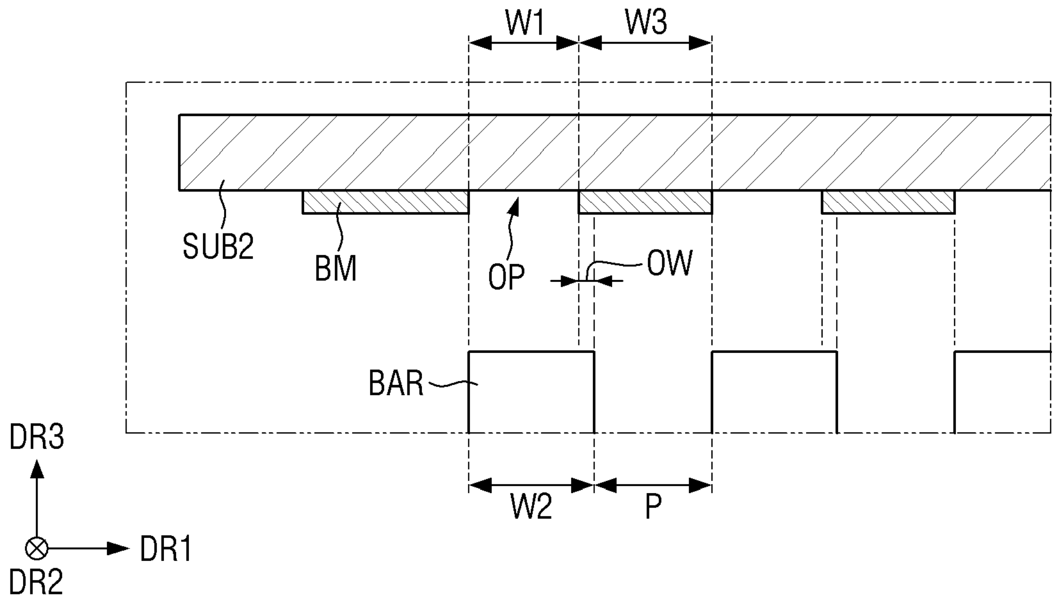
FIG. 21 is a schematic cross-sectional view schematically illustrating a light blocking member and color filter pattern layers of the display device according to the embodiment of FIG. 20.
Figure 22:
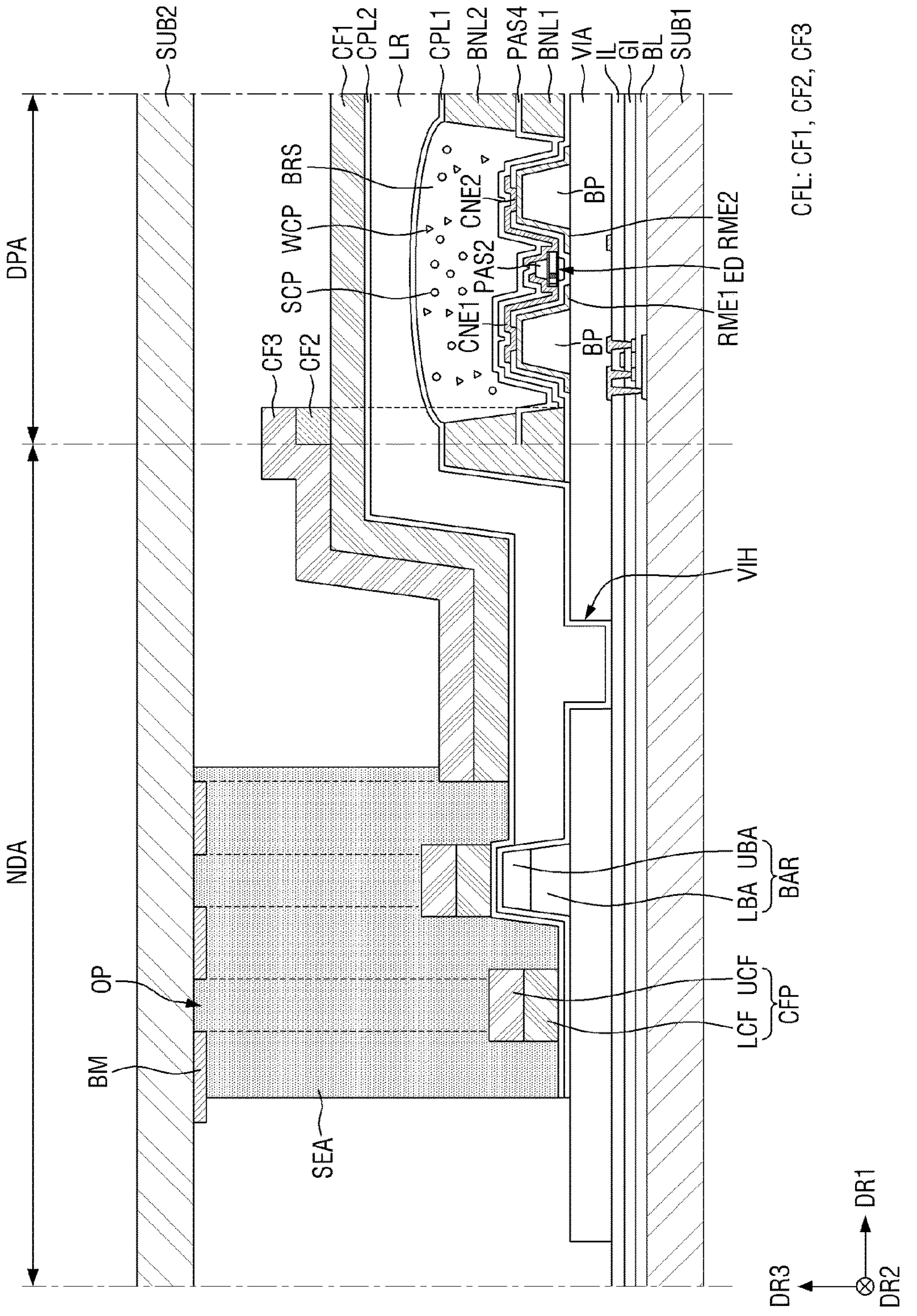
FIG. 22 is a schematic cross-sectional view of a display device according to an embodiment.
Figure 23:
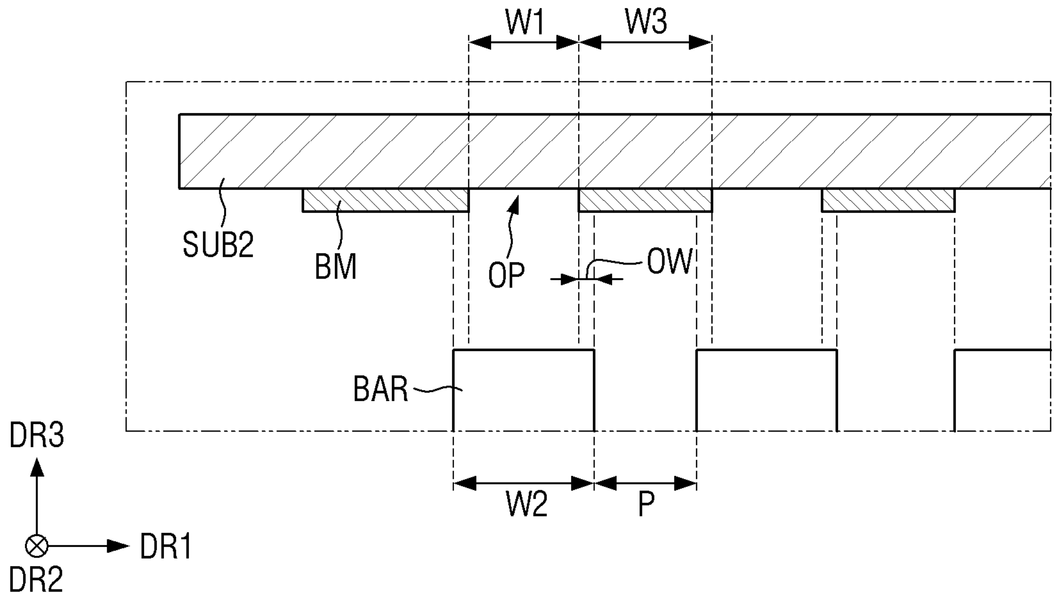
FIG. 23 is a schematic cross-sectional view schematically illustrating a light blocking member and color filter pattern layers of the display device according to the embodiment of FIG. 22.

FIG. 20 is a schematic cross-sectional view of a display device according to an embodiment. FIG. 21 is a schematic cross-sectional view schematically illustrating a light blocking member BM and barrier ribs BAR of the display device according to the embodiment of FIG. 20. FIG. 22 is a schematic cross-sectional view of a display device according to an embodiment. FIG. 23 is a schematic cross-sectional view schematically illustrating a light blocking member BM and barrier ribs BAR of the display device according to the embodiment of FIG. 22.

Referring to FIGS. 20, 21, and 23, the current embodiments are different from the above-described embodiments in that the light blocking member BM and the color filter pattern layers CFP overlap (e.g., partially overlap). Thus, descriptions overlapping those of the above-described embodiments will be omitted, and differences will be described for descriptive convenience.

Referring to FIGS. 20 and 21, in an embodiment, the light blocking member BM and the color filter pattern layers CFP may overlap (e.g., partially overlap) each other in the third direction DR3. For example, a side surface of each color filter pattern layer CFP may be aligned with a side surface of the light blocking member BM in the third direction DR3. For example, another side surface facing the above side surface of each color filter pattern layer CFP may overlap an upper surface of the light blocking member BM in the third direction DR3. For example, a side surface of each opening OP of the light blocking member BM may be aligned with a side surface of a color filter pattern layer CFP in the third direction DR3. For example, another side surface facing the above side surface of each opening OP of the light blocking member BM may overlap an upper surface of the color filter pattern layer CFP in the third direction DR3. In an embodiment, a width OW of each area where a color filter pattern layer CFP and the light blocking member BM overlap may be 50% or less of a width W3 of the light blocking member BM.

In an embodiment, the openings OP of the light blocking member BM may overlap (e.g., completely overlap) the color filter pattern layers CFP. A width W1 of each opening OP may be smaller than a width W2 of each color filter pattern layer CFP. For example, the width W2 of each color filter pattern layer CFP may be greater than the width W1 of each opening OP. For example, the light blocking member BM may overlap a gap P between the color filter pattern layers CFP in the third direction DR3. In an embodiment, the gap P between the color filter pattern layers CFP may overlap (e.g., completely overlap) the light blocking member BM. The width W3 of the light blocking member BM may be greater than the gap P between the color filter pattern layers CFP. For example, the gap P between the color filter pattern layers CFP may be smaller than the width W3 of the light blocking member BM.

Referring to FIGS. 22 and 23, in an embodiment, the light blocking member BM and the color filter pattern layers CFP may overlap (e.g., partially overlap) each other in the third direction DR3. For example, a side surface of each color filter pattern layer CFP may overlap an upper surface of the light blocking member BM in the third direction DR3. For example, another side surface facing the above side surface of each color filter pattern layer CFP may overlap the upper surface of the light blocking member BM in the third direction DR3. For example, a side surface of each opening OP of the light blocking member BM and another side surface facing the above side surface may overlap an upper surface of the same color filter pattern layer CFP. In an embodiment, a width OW of each area where a color filter pattern layer CFP and the light blocking member BM overlap may be 50% or less of a width W3 of the light blocking member BM.

As described above, since the light blocking member BM and the color filter pattern layers CFP overlap (e.g., partially overlap), an alignment margin of a first substrate SUB1 and a second substrate SUB2 may be secured or assured, thereby preventing a non-display area NDA from being recognized by a user.

Figure 24:
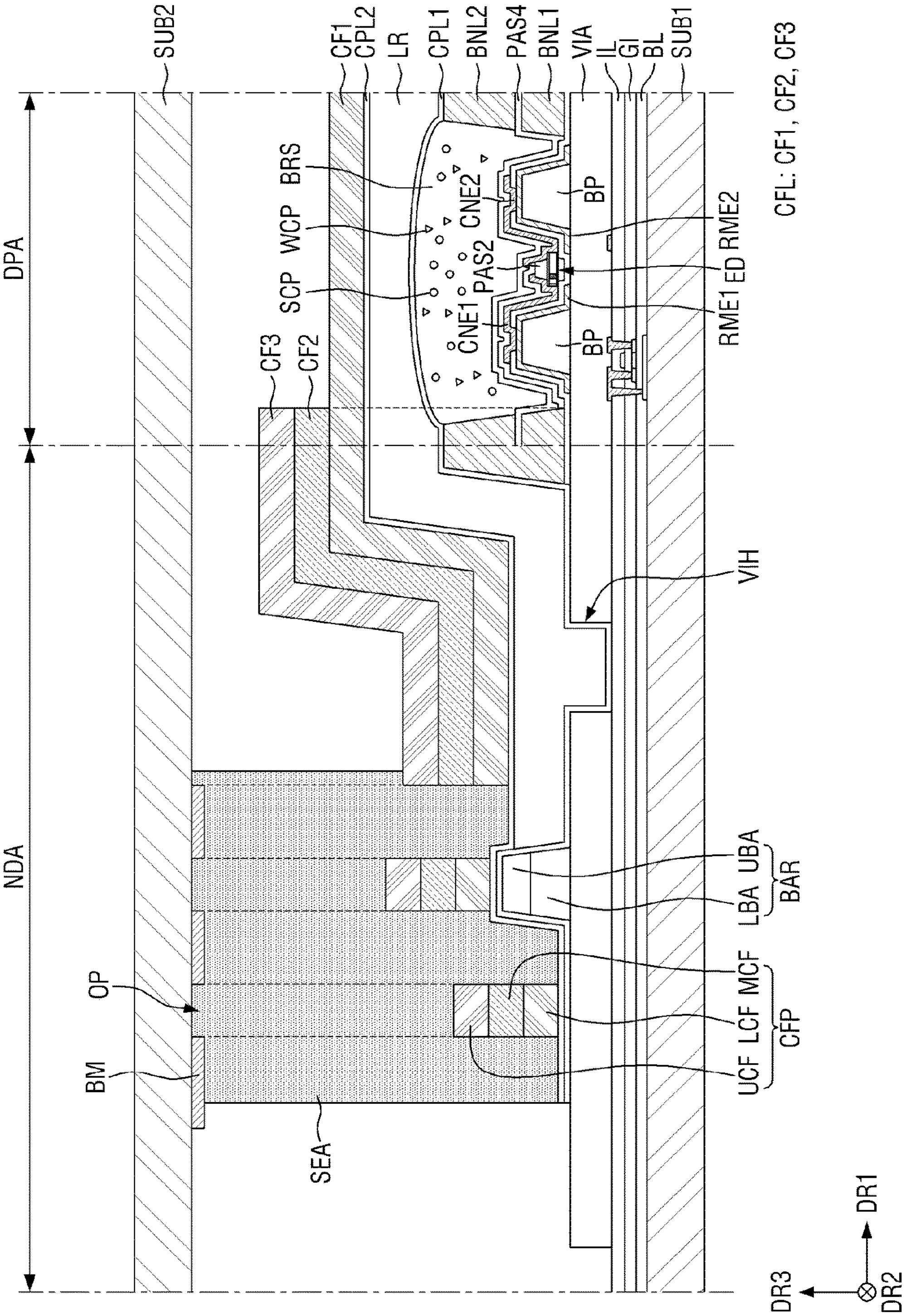
FIG. 24 is a schematic cross-sectional view of a display device according to an embodiment.

FIG. 24 is a schematic cross-sectional view of a display device according to an embodiment.

The embodiment of FIG. 24 is different from the above-described embodiments in that each color filter pattern layer CFP further includes a middle pattern layer MCF between a lower pattern layer LCF and an upper pattern layer UCF. Thus, descriptions overlapping those of the above-described embodiments will be omitted, and differences will be described for descriptive convenience.

Color filters may be stacked in a color filter layer CFL. For example, the color filter layer CFL may have a three-layer structure, and a first color filter CF1, a second color filter CF2 and a third color filter CF3 may be stacked with each other. The first color filter CF1 may be disposed (e.g., directly disposed) on a second capping layer CPL2, the second color filter CF2 may be disposed (e.g., directly disposed) on the first color filter CF1, and the third color filter CF3 may be disposed (e.g., directly disposed) on the second color filter CF2.

Each of the color filter pattern layers CFP may include the lower pattern layer LCF, the middle pattern layer MCF disposed on the lower pattern layer LCF, and the upper pattern layer UCF disposed on the middle pattern layer MCF. The lower pattern layer LCF and the first color filter CF1 may include (or be formed of) a same material. For example, the lower pattern layer LCF and the first color filter CF1 may have a same height. The middle pattern layer MCF and the second color filter CF2 may include (or be formed of) a same material. For example, the middle pattern layer MCF and the second color filter CF2 may have a same height. The upper pattern layer UCF and the third color filter CF3 may include (or be formed of) a same material. For example, the upper pattern layer UCF and the third color filter CF3 may have a same height.

For example, each of the color filter pattern layers CFP may have a structure in which the first color filter CF1, the second color filter CF2, and the third color filter CF3 are stacked with each other. The lower pattern layer LCF may be disposed (e.g., directly disposed) on the second capping layer CPL2 to contact the second capping layer CPL2. The middle pattern layer MCF may be disposed (e.g., directly disposed) on the lower pattern layer LCF to contact the lower pattern layer LCF. The upper pattern layer UCF may be disposed (e.g., directly disposed) on the middle pattern layer MCF to contact the middle pattern layer MCF. The lower pattern layer LCF, the middle pattern layer MCF, and the upper pattern layer UCF may have the same planar size and may overlap (e.g., completely overlap) each other. For example, side surfaces of the lower pattern layer LCF, side surfaces of the middle pattern layer MCF, and side surfaces of the upper pattern layer UCF may be aligned with each other.

As described above, since the color filter pattern layers CFP have a three-layer structure in which three color filters are stacked, they can further absorb and block external light incident on a non-display area NDA, thereby improving display quality.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:

a first substrate comprising a display area and a non-display area;

an inorganic layer disposed on the first substrate in the non-display area;

color filter pattern layers disposed on the inorganic layer and spaced apart from each other;

a second substrate facing the first substrate;

a light-blocking member disposed on a surface of the second substrate, the light-blocking member not overlapping the color filter pattern layers in the non-display area; and a seal member disposed between the first substrate and the second substrate, the seal member contacting the color filter pattern layers and the inorganic layer, wherein a first edge and a second edge of the light-blocking member are respectively aligned with edges of the color filter pattern layers in a thickness direction of the first substrate, and wherein an edge of the seal member is aligned with an edge of the inorganic layer.

2. The display device of claim 1, wherein the seal member is disposed in the non-display area and overlaps the light-blocking member, the color filter pattern layers, and the inorganic layer.

3. The display device of claim 1, wherein the seal member contacts the inorganic layer exposed between the color filter pattern layers.

4. The display device of claim 1, wherein the light-blocking member comprises openings, and wherein the openings of the light-blocking member overlap the color filter pattern layers in the thickness direction.

5. The display device of claim 4, wherein a width of each of the openings of the light-blocking member is substantially equal to a width of each of the color filter pattern layers respectively overlapping the openings of the light-blocking member in the thickness direction.

6. The display device of claim 4, wherein a gap between the edges of the color filter pattern layers is substantially equal to a width of the light-blocking member.

7. The display device of claim 1, further comprising a color filter layer disposed on the inorganic layer and extending from the display area to the non-display area, and comprising a first color filter, a second color filter, and a third color filter configured to transmit light of different colors, respectively.

8. The display device of claim 7, wherein each of the color filter pattern layers comprises a lower pattern layer disposed on the inorganic layer and an upper pattern layer disposed on the lower pattern layer.

9. The display device of claim 8, wherein the lower pattern layer and the first color filter comprise a same material, and wherein the upper pattern layer and the third color filter comprise a same material.

10. The display device of claim 8, wherein each of the color filter pattern layers further comprises a middle pattern layer disposed between the lower pattern layer and the upper pattern layer, and wherein the middle pattern layer and the second color filter comprise a same material.

11. The display device of claim 7, wherein the seal member overlaps a portion of the color filter layer, and wherein the light-blocking member does not overlap the color filter layer.

12. The display device of claim 7, wherein the color filter pattern layers are spaced apart from the color filter layer in the non-display area.

* * * * *